(12) United States Patent
Park et al.

(10) Patent No.: US 10,693,432 B2
(45) Date of Patent: Jun. 23, 2020

(54) SOLENOID STRUCTURE WITH CONDUCTIVE PILLAR TECHNOLOGY

(71) Applicant: QUALCOMM Incorporated, San Diego, CA (US)

(72) Inventors: Nosun Park, Incheon (KR); Changhan Hobie Yun, San Diego, CA (US); Jonghae Kim, San Diego, CA (US); Niranjan Sunil Mudakatte, San Diego, CA (US); Xiaoju Yu, San Diego, CA (US); Wei-Chuan Chen, San Diego, CA (US)

(73) Assignee: QUALCOMMM Incorporated, San Diego, CA (US)

( * ) Notice: Subject to any disclaimer, the term of this patent is extended or adjusted under 35 U.S.C. 154(b) by 170 days.

(21) Appl. No.: 15/982,655

(22) Filed: May 17, 2018

(65) Prior Publication Data

US 2019/0356294 A1    Nov. 21, 2019

(51) Int. Cl.
*H03H 7/01* (2006.01)
*H01F 27/40* (2006.01)
(Continued)

(52) U.S. Cl.
CPC ........... *H03H 7/0115* (2013.01); *H01F 27/40* (2013.01); *H01L 21/565* (2013.01);
(Continued)

(58) Field of Classification Search
CPC ...... H03H 7/0115; H03H 1/0007; H03H 3/00; H03H 2001/005; H01F 27/40;
(Continued)

(56) References Cited

U.S. PATENT DOCUMENTS 9,059,026 B2   6/2015   Yen et al.
9,368,564 B2   6/2016   Zuo et al.
(Continued)

FOREIGN PATENT DOCUMENTS

EP    3255658 A1    12/2017
WO    2017000361 A1    1/2017

OTHER PUBLICATIONS

International Search Report and Written Opinion—PCT/US2019/022423—ISA/EPO—dated Jul. 4, 2019.

*Primary Examiner* — Benny T Lee
*Assistant Examiner* — Hafizur Rahman
(74) *Attorney, Agent, or Firm* — Qualcomm Incorporated/Seyfarth Shaw LLP

(57) ABSTRACT

A three-dimensional (3D) solenoid structure includes a first inductor portion having a first surface and a second surface opposite the first surface. The 3D solenoid structure further includes a first capacitor portion, a first inductor pillar, at least one capacitor pillar, a second inductor portion, a second inductor pillar and a first inductor bonding interface. The first inductor pillar is coupled to the first surface of the first inductor portion. The capacitor pillar(s) is coupled to the first capacitor portion. The second inductor portion includes a first surface and a second surface opposite the first surface. The second inductor pillar is coupled to the first surface of the second inductor portion. The first inductor bonding interface, between the first inductor pillar and the second inductor pillar, couples together the first inductor portion and the second inductor portion.

20 Claims, 18 Drawing Sheets

(51) Int. Cl.
  *H01L 21/56* (2006.01)
  *H01L 21/683* (2006.01)
  *H01L 23/29* (2006.01)
  *H01L 23/31* (2006.01)
  *H01L 23/00* (2006.01)
  *H01L 25/16* (2006.01)
  *H01L 27/01* (2006.01)
  *H01L 49/02* (2006.01)
  *H03H 1/00* (2006.01)
  *H03H 3/00* (2006.01)

(52) U.S. Cl.
  CPC ........ *H01L 21/6836* (2013.01); *H01L 23/293* (2013.01); *H01L 23/3142* (2013.01); *H01L 24/16* (2013.01); *H01L 25/16* (2013.01); *H01L 27/01* (2013.01); *H01L 28/10* (2013.01); *H01L 28/60* (2013.01); *H03H 1/0007* (2013.01); *H03H 3/00* (2013.01); *H01L 24/13* (2013.01); *H01L 2221/68327* (2013.01); *H01L 2224/13147* (2013.01); *H01L 2224/16268* (2013.01); *H01L 2924/19011* (2013.01); *H01L 2924/19041* (2013.01); *H01L 2924/19042* (2013.01); *H03H 2001/005* (2013.01)

(58) Field of Classification Search
  CPC . H01L 21/565; H01L 21/6836; H01L 23/293; H01L 23/3142; H01L 24/16; H01L 25/16; H01L 27/01; H01L 28/10; H01L 28/60; H01L 24/13; H01L 2221/68327; H01L 2224/13147; H01L 2224/16268; H01L 2924/19011; H01L 2924/19041; H01L 2424/19042
  USPC ........................................................ 333/185
  See application file for complete search history.

(56) References Cited

U.S. PATENT DOCUMENTS

| | | |
|---|---|---|
| 9,385,105 B2 | 7/2016 | Meyer et al. |
| 2009/0246474 A1 | 10/2009 | Sakurai et al. |
| 2012/0019980 A1 | 1/2012 | Cho et al. |
| 2014/0299986 A1 | 10/2014 | Sakurai et al. |
| 2014/0354378 A1* | 12/2014 | Zuo ............... H03H 7/0115 333/185 |
| 2015/0201495 A1 | 7/2015 | Kim et al. |
| 2015/0279920 A1 | 10/2015 | Zuo et al. |
| 2017/0018348 A1 | 1/2017 | Mak et al. |
| 2017/0062119 A1 | 3/2017 | Zybura et al. |
| 2017/0084581 A1 | 3/2017 | Kikuchi et al. |

* cited by examiner

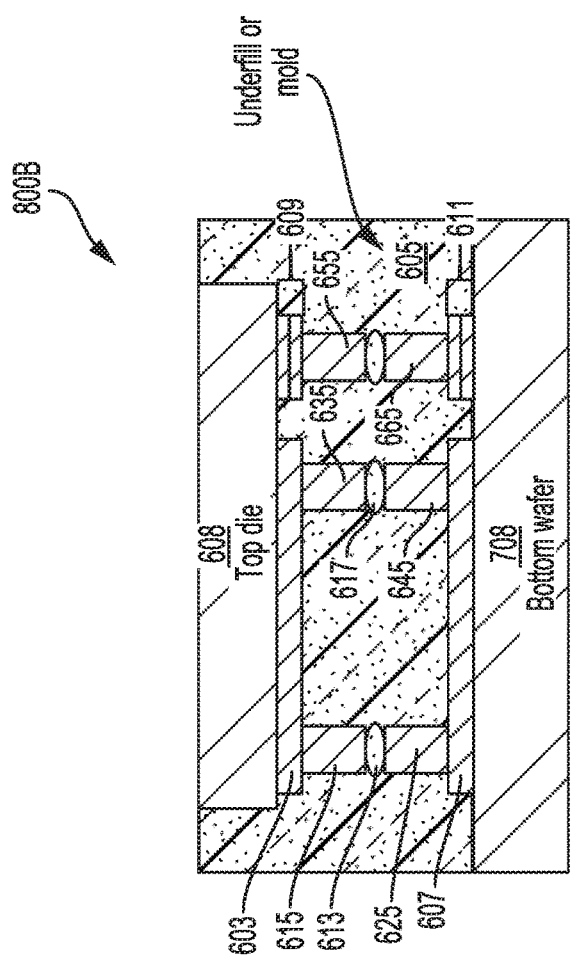
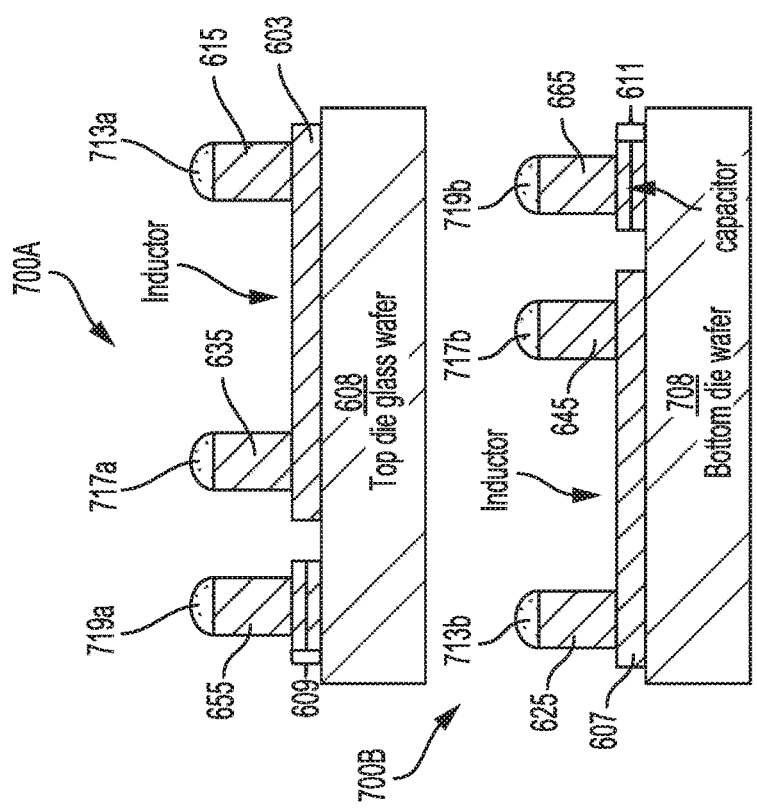
FIG. 8B
FIG. 8A

SOLENOID STRUCTURE WITH CONDUCTIVE PILLAR TECHNOLOGY

BACKGROUND

Field

Aspects of the present disclosure relate to semiconductor devices and, more particularly, to solenoid structures with conductive pillar technology.

Background

Mobile radio frequency (RF) chips (e.g., mobile RF transceivers) have migrated to a deep sub-micron process node due to cost and power consumption considerations. The design complexity of mobile RF transceivers is further complicated by adding circuit functions for supporting communication enhancements, such as fifth generation (5G) technologies. Further design challenges for mobile RF transceivers include analog/RF performance considerations, including mismatch, noise and other performance considerations. Designing these mobile RF transceivers includes using passive devices, for example, for suppressing resonance, and/or for performing filtering, bypassing, and coupling.

Successfully fabricating modern semiconductor chip products involves interplay between the materials and the processes employed. In particular, passive components for modern semiconductor chips is an increasingly challenging part of the process flow. This is particularly true in terms of maintaining a small feature size. The same challenge of maintaining a small feature size also applies to passive-on-glass (POG) technology.

SUMMARY

A three-dimensional (3D) solenoid structure may include a first inductor portion having a first surface and a second surface opposite the first surface. The 3D solenoid structure further includes a first capacitor portion, a first inductor pillar, one or more capacitor pillars, a second inductor portion, a second inductor pillar, and a first inductor bonding interface. The first inductor pillar is coupled to the first surface of the first inductor portion. The one or more capacitor pillars is coupled to the first capacitor portion. The second inductor portion includes a first surface and a second surface opposite the first surface. The second inductor pillar is coupled to the first surface of the second inductor portion. The first inductor bonding interface is between the first inductor pillar and the second inductor pillar to couple the first inductor portion and the second inductor portion.

A method of fabricating a three-dimensional (3D) solenoid structure may include fabricating a first surface and a second surface opposite the first surface. The method may further include fabricating a first capacitor portion, a first inductor pillar, one or more capacitor pillars, a second inductor portion, a second inductor pillar, and a first inductor bonding interface. The first inductor pillar is coupled to the first surface of the first inductor portion. The one or more capacitor pillars is coupled to the first capacitor portion. The second inductor portion includes a first surface and a second surface opposite the first surface. The second inductor pillar is coupled to the first surface of the second inductor portion. The first inductor bonding interface is between the first inductor pillar and the second inductor pillar to couple the first inductor portion and the second inductor portion.

A three-dimensional (3D) solenoid structure may include a first inductor portion including a first surface and a second surface opposite the first surface. The 3D solenoid structure further includes a first capacitor portion, a first inductor pillar, one or more capacitor pillars, a second inductor portion, a second inductor pillar and means for bonding the first inductor pillar and the second inductor pillar to couple the first inductor portion and the second inductor portion. The first inductor pillar is coupled to the first surface of the first inductor portion. The one or more capacitor pillars is coupled to the first capacitor portion. The second inductor portion includes a first surface and a second surface opposite the first surface. The second inductor pillar is coupled to the first surface of the second inductor portion.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 8A-8F illustrate multiple stages of another process for fabricating a three-dimensional solenoid structure, according to aspects of the present disclosure.

DETAILED DESCRIPTION

Figure 1:
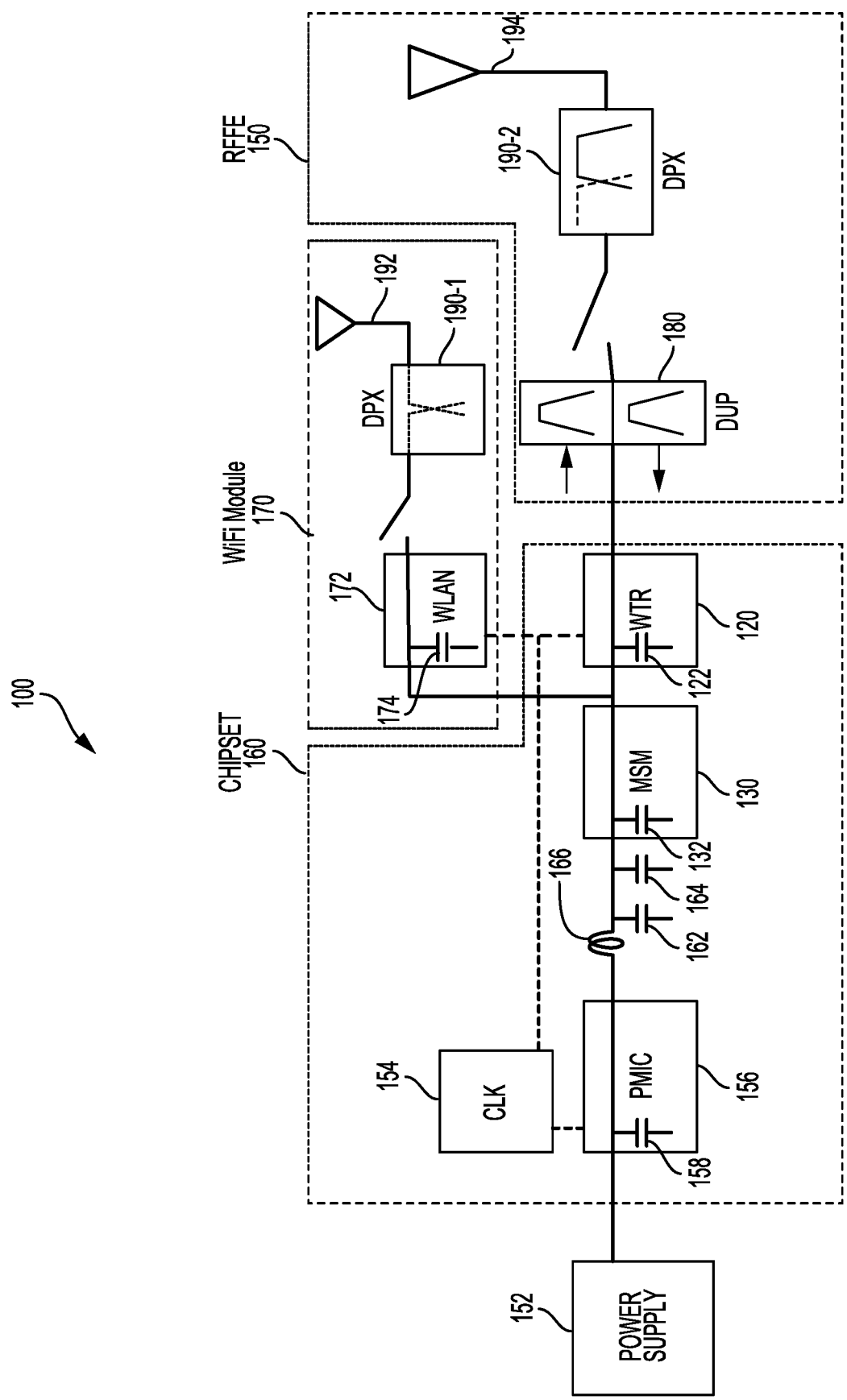
FIG. 1 is a diagram of a radio frequency (RF) communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. Other aspects, as well as features and advantages of various aspects, will become apparent to those of skill in the art through consideration of the ensuing description, the accompanying drawings, and the appended claims.

The use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Mobile radio frequency (RF) chip designs (e.g., mobile RF transceivers) have migrated to a deep sub-micron process node due to cost and power consumption considerations. The design complexity of mobile RF transceivers is further complicated by added circuit functions for supporting communication enhancements, such as fifth generation (5G) wireless systems. Implementing 5G wireless systems increasingly involves additional passive devices. For example, two-dimensional (2D) passive-on-glass (POG) filters leverage stacked copper (Cu) inductors and copper/silicon nitride (SiN)/copper (Cu/SiN/Cu) metal-insulator-metal (MIM) capacitors. Unfortunately, design rules in 5G wireless systems restrict the design of these additional passive devices. For example, at higher frequencies (e.g., three GHz and above), low capacitance values are used, thereby increasing capacitor size due to serial capacitor stacking. The increased series capacitor stacking results in a larger POG filter size.

Passive-on-glass devices include high-performance inductor and capacitor components having a variety of advantages over other technologies, such as surface mount technology or multi-layer ceramic chips. These advantages include a more compact size and smaller manufacturing variations. Passive-on-glass devices also support a higher quality (Q)-factor value that meets stringent low insertion loss and low power consumption specifications of future process nodes. Passive devices such as inductors may be implemented as three-dimensional (3D) structures when using passive-on-glass technologies. 3D through substrate inductors or other 3D devices, however, may experience a number of design constraints when implemented as 3D structures using passive-on-glass technology. For example, a through glass via (TGV) is used to implement high performance solenoid type inductors for 5G radio frequency applications. However, via formation/via filling processes can cause quality issues, incur high costs, use complex process flow, and use complex supply chains. Additionally, through glass via technology has limitations on high aspect ratio/fine pitch through glass vias.

Aspects of the present disclosure are directed to fabricating a solenoid structure using conductive (e.g., copper (Cu)) pillar technology instead of through glass via technology. For example, a 3D solenoid structure includes a first inductor portion including a first surface and a second surface opposite the first surface as well as a first inductor pillar coupled to the first surface of the first inductor portion. The three-dimensional solenoid structure further includes a second inductor portion including a first surface and a second surface opposite the first surface as well as a second inductor pillar coupled to the first surface of the second inductor portion. The three-dimensional solenoid structure further includes a first capacitor portion. The first capacitor portion may include a metal-insulator-metal (MIM) capacitor. A first inductor bonding interface is coupled between the first inductor pillar and the second inductor pillar. The first inductor bonding interface couples the first inductor portion and the second inductor portion.

In some aspects, a molding compound between the first inductor portion and the second inductor portion, among others, encapsulates at least a portion of the three-dimensional solenoid structure. The molding compound may be an epoxy molding compound or capillary underfill material.

The three-dimensional solenoid structure further includes a substrate (e.g., a glass substrate or a laminate substrate). The second surface of the first inductor portion and the first capacitor portion are on the glass substrate. The three-dimensional solenoid structure also includes a second capacitor portion opposite the first capacitor portion, with at least one capacitor pillar coupled to the second capacitor portion. At least one capacitor pillar may also be coupled to the first capacitor portion. In one aspect, a capacitor bonding interface is between the capacitor pillar(s) coupled to the first capacitor portion and the capacitor pillar(s) coupled to the second capacitor portion. The capacitor bonding interface couples the first capacitor portion and the second capacitor portion to form (in combination with the inductor) the three-dimensional solenoid structure.

The three-dimensional solenoid structure further includes a third inductor pillar coupled to the first surface of the first inductor portion and a fourth inductor pillar coupled to the first surface of the second inductor portion. A second inductor bonding interface is coupled between the third inductor pillar and the fourth inductor pillar. The second inductor bonding interface couples the first inductor portion and the second inductor portion to form the three-dimensional solenoid structure.

Because the high performance solenoid type inductor is formed without a through glass via first implementation, the process flow is simple and short. The formation of the solenoid structure using the copper pillar technology is also low in cost because there are no costs for via formation and filling. Moreover, the yield is high because of the "known good die" aspect where the quality of each die is known before coupling a first pillar of a first die to a second pillar of a second die.

The aspects of the present disclosure further achieve flexible thickness control by a bump plating process, which improves fine tuning and achieves fine pitch (e.g., up to 40 micrometers) between device regions. Furthermore, all processes for this aspect can be conducted at one outsourced semiconductor assembly and test (OSAT), which simplifies the supply chain.

FIG. 1 is a schematic diagram of a radio frequency (RF) communications system 100 including a solenoid structure (e.g., a three-dimensional solenoid structure) integrated with a duplexer 180, according to an aspect of the present disclosure. Representatively, the RF communications system 100 includes a WiFi module 170 having a first diplexer 190-1 and an RF front-end module 150 including a second diplexer 190-2 for a chipset 160 to provide carrier aggregation according to an aspect of the present disclosure. The WiFi module 170 includes the first diplexer 190-1 communicably coupling an antenna 192 to a wireless local area network module (e.g., WLAN module 172). The RF front-end module 150 includes the second diplexer 190-2 communicably coupling an antenna 194 to a wireless transceiver (WTR) 120 through the duplexer 180. The wireless transceiver 120 and the WLAN module 172 of the WiFi module 170 are coupled to a modem (mobile station modem (MSM), e.g., baseband modem) 130 that is powered by a power supply 152 through a power management integrated circuit (PMIC) 156.

The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components. The RF communications system 100 may also include a power amplifier (PA) integrated with the duplexer 180 (e.g., a power amplifier with integrated duplexer (PAMiD) module). The duplexer 180 may filter the input/output signals according to a variety of different parameters, including frequency, insertion loss, rejection, or other like parameters.

Figure 2:
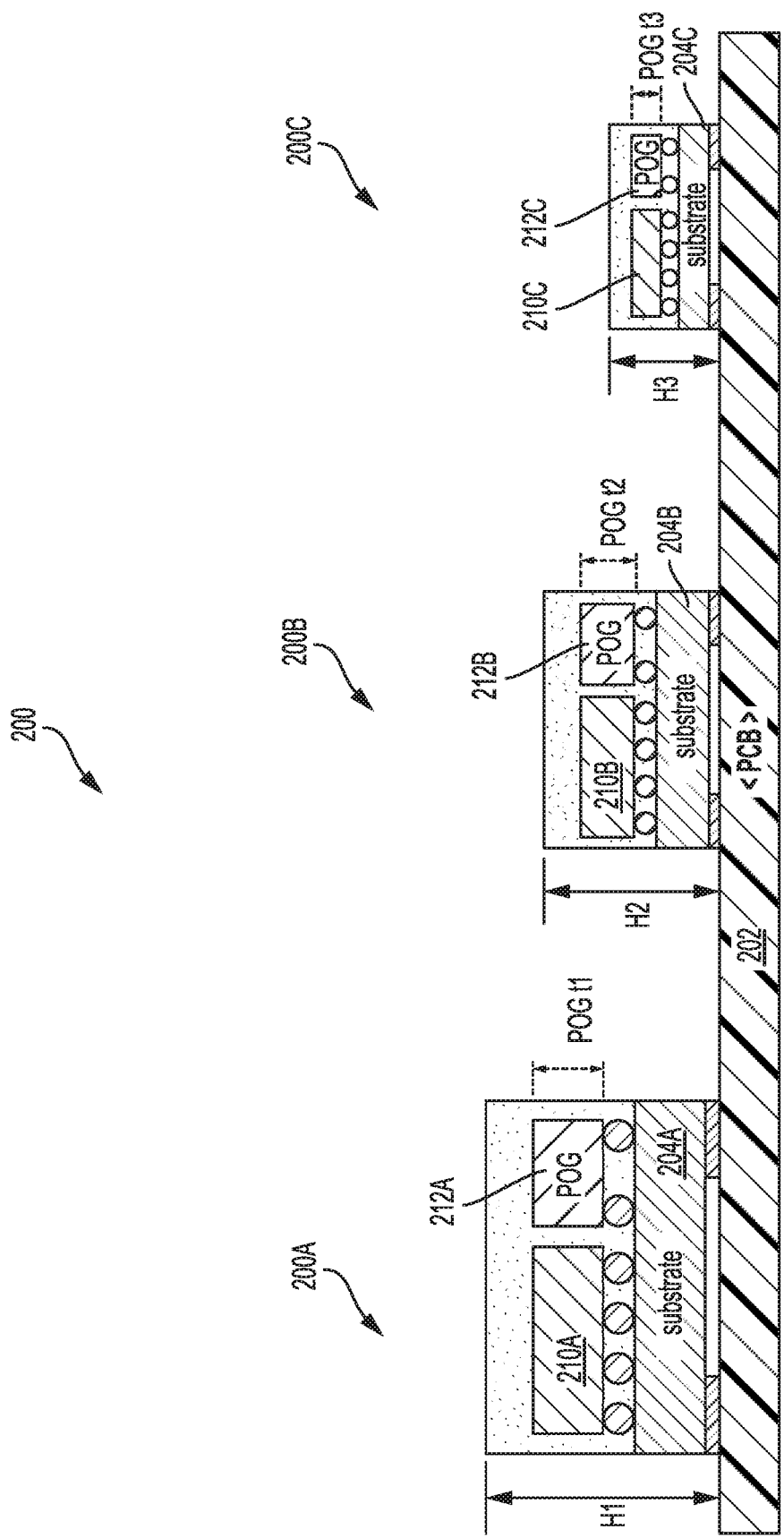
FIG. 2 illustrates a passive device module (e.g., inductor-capacitor (LC) filter).

FIG. 2 illustrates a passive device module 200 (e.g., inductor-capacitor (LC) filter). The passive device module 200 (e.g., passive device modules 200A, 200B, and 200C) may include a conventional device module 210 (e.g., conventional filter) and a passive-on-glass (POG) device module 212 (e.g., passive-on-glass filter). Each of the filters may include capacitors (not shown) that are coupled to inductors (not shown). The conventional device module 210 (e.g., conventional device modules 210A, 201B, and 210C) and the passive-on-glass device module 212 (e.g., passive-on-glass device modules 212A, 212B, and 212C) are coupled to a substrate 204 (e.g., substrates 204A, 204B and 204C). The substrate 204 is coupled to a printed circuit board (PCB) 202. There is a trend/demand for a thinner passive device module 200 including thinner passive-on-glass device modules 212.

As the height of the passive device module 200 shrinks from a height of H1 (as shown with respect to the passive device module 200A), to a height of H2 (as shown with respect to the passive device module 200B), and then to a height of H3 (as shown with respect to the passive device module 200C), the passive-on-glass device modules 212 and the conventional device modules 210 also shrink. For example, the passive-on-glass device module 212 shrinks or thins from a height of t1 (as shown with respect to the passive-on-glass device module 212A), to a smaller height of t2 (as shown with respect to the passive-on-glass device module 212B), and then to a smallest height of t3 (as shown with respect to the passive-on-glass module 212C). Similar shrinking occurs with respect to the conventional device modules 210A, 201B, and 210C. The passive device module 200 can be used in many electronic devices including a multiplexer (e.g., diplexer). It is noted that the passive device module 200 may be used in other electronic devices aside from diplexers.

Figure 3A:
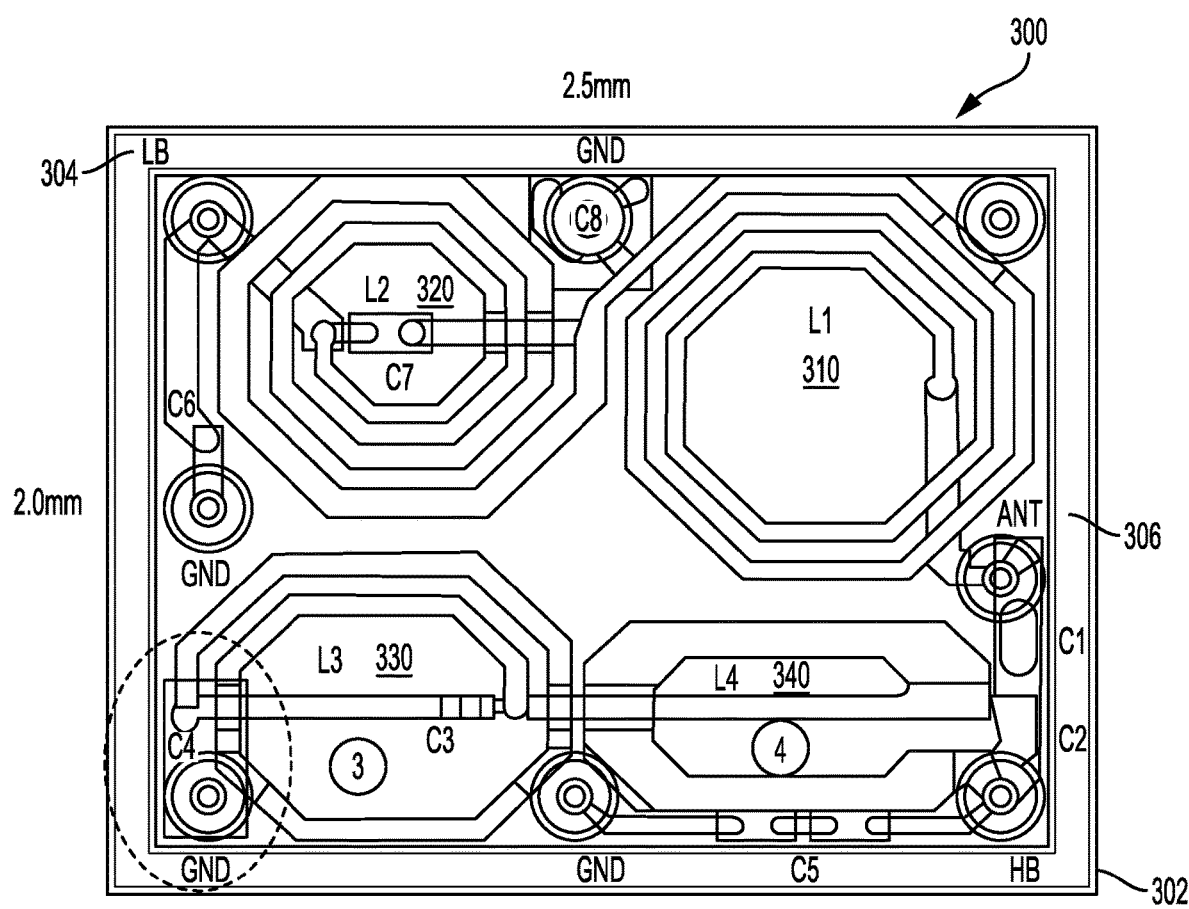
FIG. 3A is a top view of a layout of a diplexer design that include a passive device module, according to an aspect of the present disclosure.

FIG. 3A is a top view of a layout of a diplexer design 300 that includes the passive device module 200 of FIG. 2, according to an aspect of the present disclosure. In this aspect, the components of the diplexer are implemented in (or on) a passive substrate 308 (see FIG. 3B). As described herein, the term "passive substrate" may refer to a substrate of a diced wafer or panel, or may refer to the substrate of a wafer/panel that is not diced. In one arrangement, the passive substrate 308 is comprised of glass, air, quartz, sapphire, high-resistivity silicon, or other like passive material. The passive substrate 308 may be a coreless substrate.

The diplexer design 300 includes a high band (HB) input path 302, a low band (LB) input path 304, and an antenna 306. In this configuration, the first inductor 310 (L1) and the second inductor 320 (L2) are implemented as 2D spiral inductors. In addition, the third inductor 330 (L3) and the fourth inductor 340 (L4) are also implemented with 2D spiral inductors. A thickness of the 2D planar inductors may be within a range of 10 to 30 micrometers. In addition, the footprint occupied by the diplexer design 300 may be in the range of 2.0 millimeters by 2.5 millimeters due to the 2D planar spiral configuration of the inductors. While this configuration may be fabricated using less complicated designs, this configuration consumes additional space.

Figure 3B:
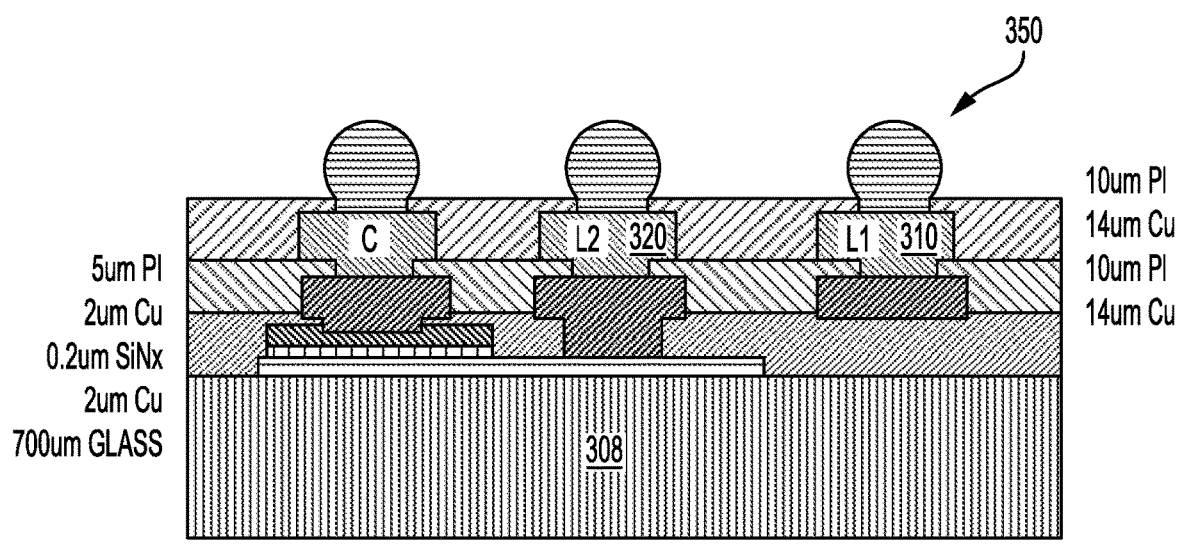
FIG. 3B shows a cross-section view of the diplexer design of FIG. 3A, according to aspects of the present disclosure.

FIG. 3B shows a cross-section view 350 of the diplexer design 300 of FIG. 3A, according to aspects of the present disclosure. For purposes of illustration, only the first inductor 310 (L1) and the second inductor 320 (L2) are shown, as supported by the passive substrate 308.

Figure 4A:
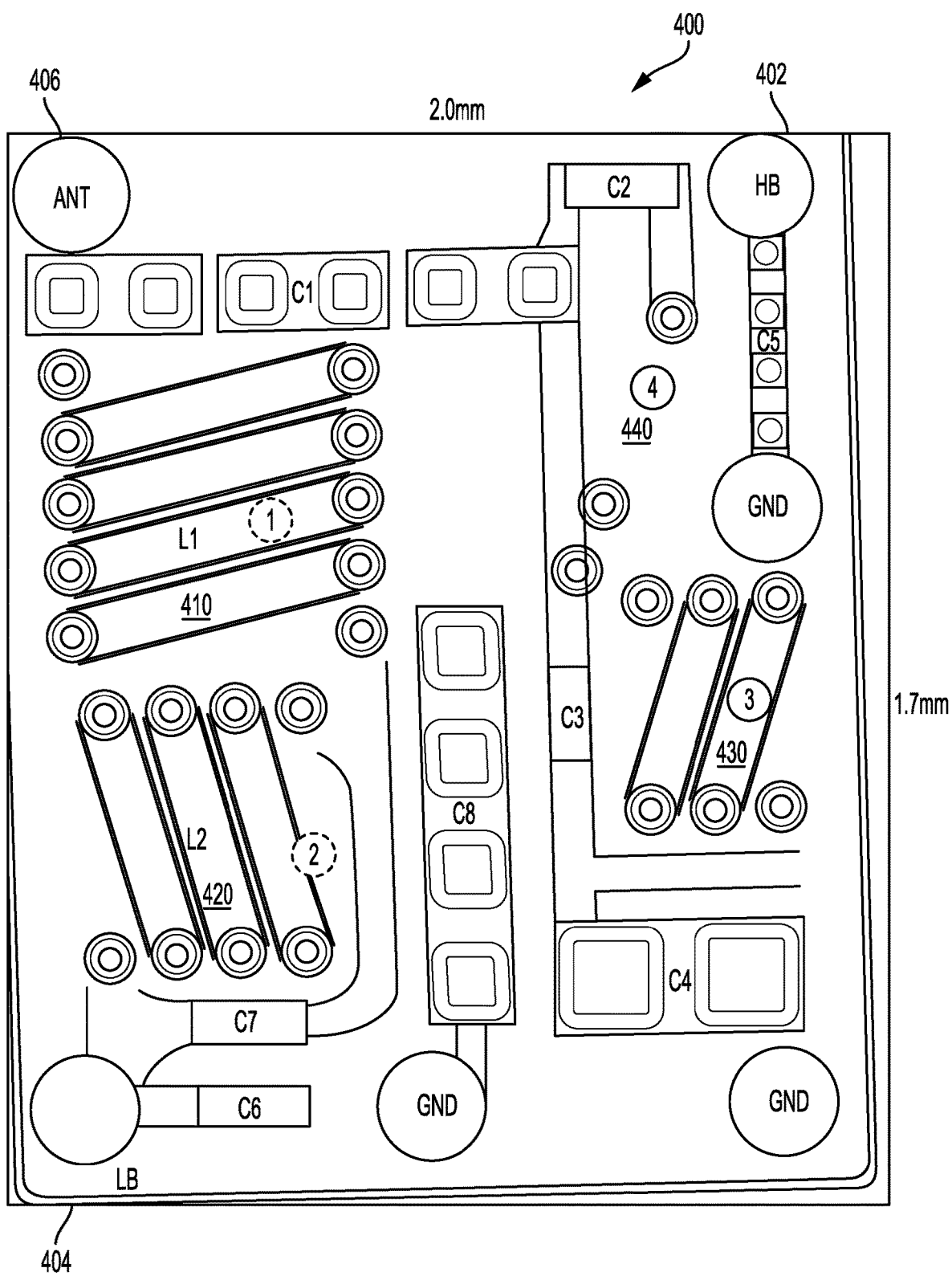
FIG. 4A is a top view of a layout of a diplexer design, according to an aspect of the present disclosure.

FIG. 4A is a top view of a layout of a diplexer design 400, according to an aspect of the present disclosure. The layout of the diplexer design 400 is in accordance with a 3D implementation. In addition, the components are implemented in (or on) a passive substrate 408 (see FIG. 4B), comprised of glass, air, quartz, sapphire, high-resistivity silicon, or other like passive material.

As shown in FIG. 4A, the diplexer design 400 includes a high band (HB) input path 402, a low band (LB) input path 404, and an antenna 406. The first inductor 410 (L1) and the second inductor 420 (L2), however, are 3D spiral inductors.

In addition, the third inductor 430 and the fourth inductor 440 are 3D spiral inductors. A reduced footprint is occupied by the diplexer design 400, which is in the range of 2 millimeters by 1.7 millimeters, relative to the diplexer design 300 of FIGS. 3A and 3B.

Figure 4B:
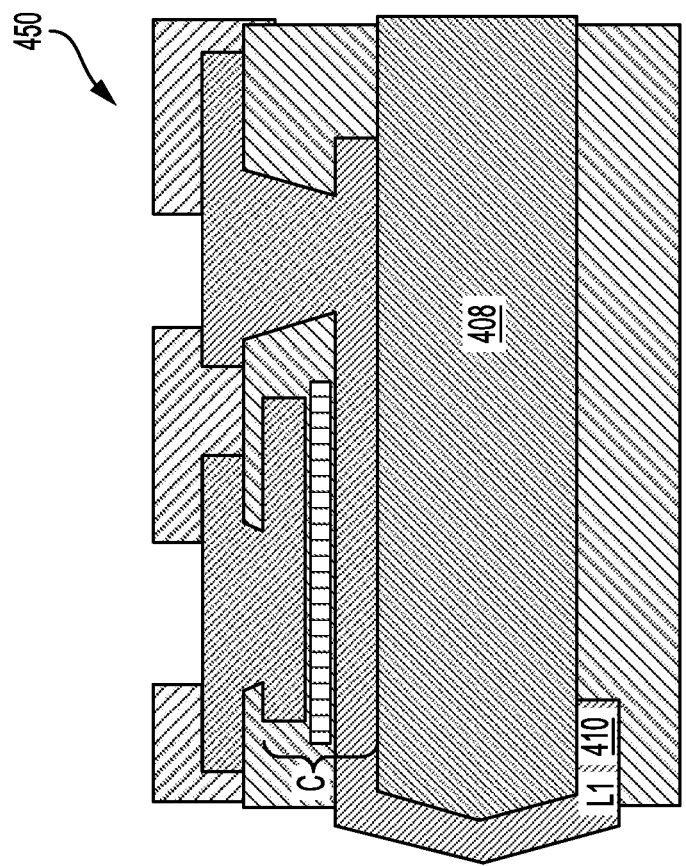
FIG. 4B shows a cross-section view of the diplexer design of FIG. 4A, according to aspects of the present disclosure.
Figure 4B:
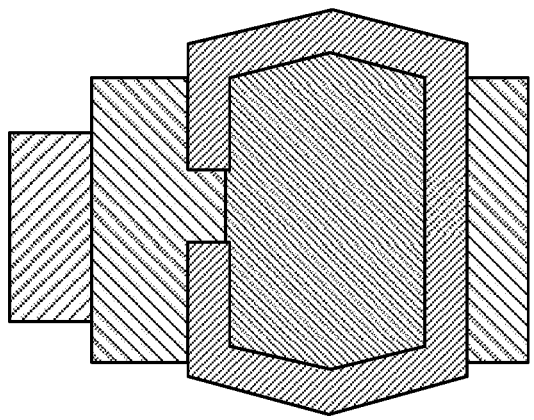
Figure 4B:
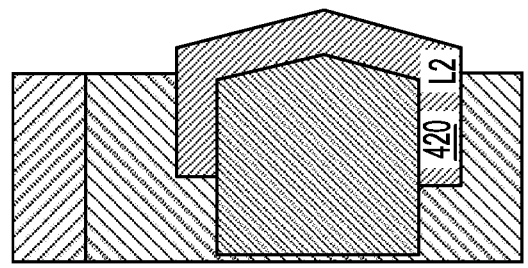

FIG. 4B shows a cross-section view 450 of the diplexer design 400 of FIG. 4A, according to aspects of the present disclosure. For purposes of illustration, only the first inductor 410 (L1) and the second inductor 420 (L2) are shown, as supported by the passive substrate 408. The structures of the various inductors and capacitors shown in FIGS. 3A to 4B are not limited to the structures shown and can take on any structure to achieve the layout of the diplexer designs 300/400. Furthermore, the geometry and layout of the various inductor and capacitor components in the diplexer may be configured to further reduce the electromagnetic coupling between the components.

In the depicted configuration of FIG. 4A, the inductors (e.g., the first inductor 410 (L1), the second inductor 420 (L2), the third inductor 430 (L3), and the fourth inductor 440 (L4)) are high performance inductors implemented in a 3D configuration as a series of traces and through substrate vias that are further illustrated in the cross-section view of FIG. 4B. Although the diplexer design 400 of FIGS. 4A and 4B occupies a smaller footprint than the diplexer design 300 of FIGS. 3A and 3B, fabrication of the diplexer design 400 is more complex and involves additional cost to implement the high performance 3D inductors (e.g., 410, 420, 430, and 440).

Figure 5:
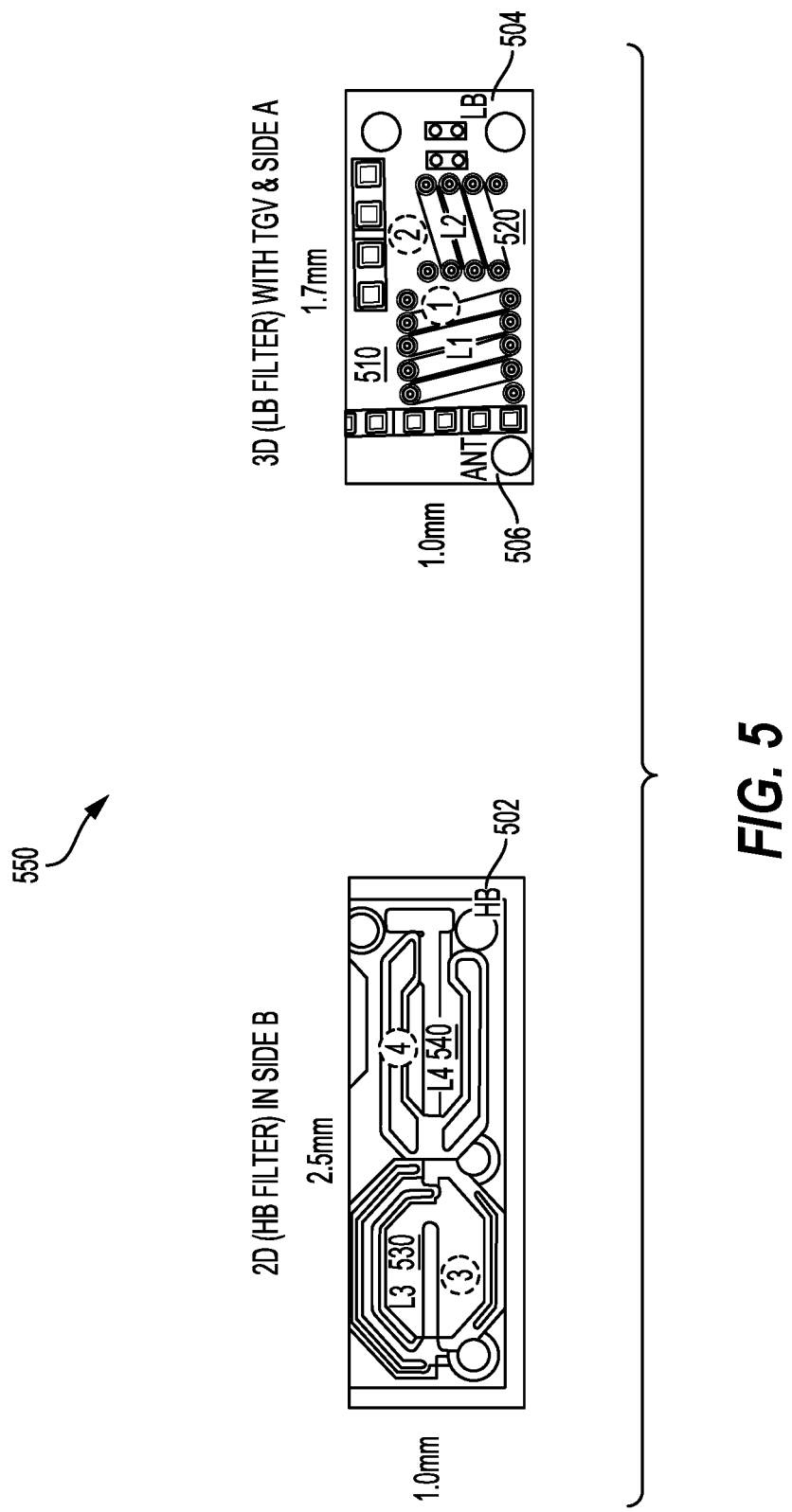
FIG. 5 illustrates a top view of components of a multiplexer structure including a two-dimensional (2D) filter integrated with a three-dimensional (3D) filter for high quality (Q)-factor RF applications, according to aspects of the present disclosure.

According to aspects of the present disclosure, a 3D implementation of the first inductor 410 and the second inductor 420 (FIG. 4A) may be integrated with a 2D implementation of the third inductor 330 and the fourth inductor 340 (FIG. 3A), for example, as shown in FIG. 5. The first inductor 410 and the second inductor 420 may be implemented using the higher cost 3D arrangement shown in FIGS. 4A and 4B to achieve higher performance. The third inductor 330 (L3) and the fourth inductor 340 (L4) may be implemented using the lower cost and simplified 2D arrangement shown in FIGS. 3A and 3B for lower performance.

FIG. 5 illustrates a top view 550 of components of a multiplexer structure including a 2D filter integrated with a 3D filter for high Q-factor RF applications, according to aspects of the present disclosure. Side B of the multiplexer structure includes a high band filter 502 including a third inductor 530 (L3) and a fourth inductor 540 (L4) implemented as 2D spiral inductors within a 1.0 millimeter by 2.5 millimeter footprint. In addition, side A of the multiplexer structure includes a low band filter 504 including a first inductor 510 (L1) and a second inductor 520 (L2)) implemented as 3D inductors within a 1.0 millimeter by 1.7 millimeter footprint. The multiplexer structure further includes a through glass via(s) (TGV) coupling the high band filter 502 and the low band filter 504.

Figure 6:
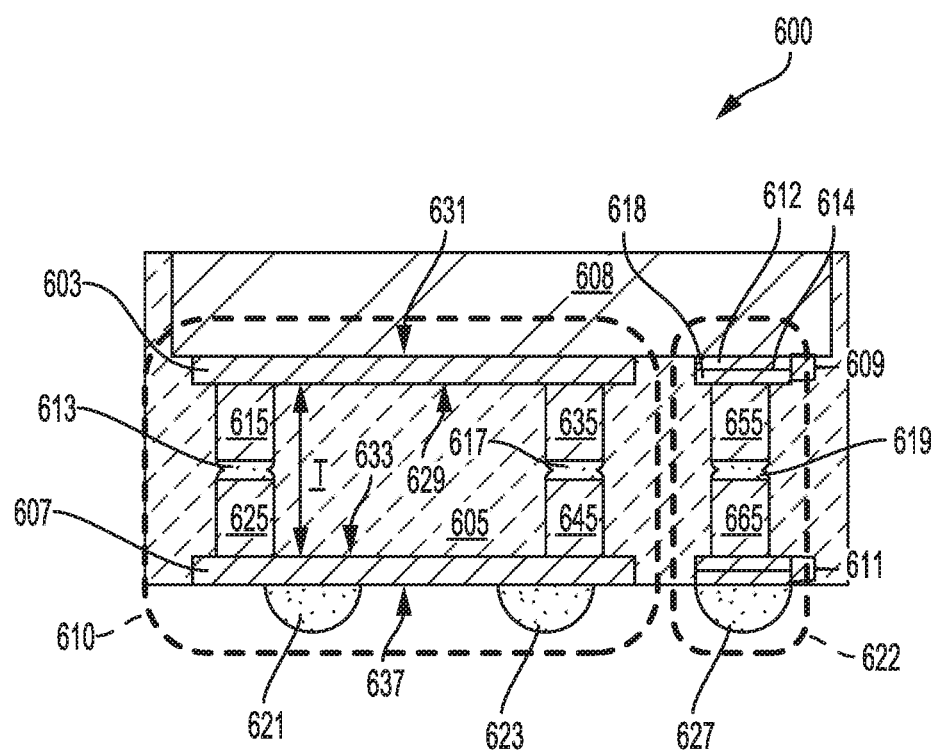
FIG. 6 illustrates a three-dimensional solenoid structure, according to aspects of the present disclosure.

FIG. 6 illustrates a three-dimensional solenoid structure 600, according to aspects of the present disclosure. The solenoid structure 600 may include a first section 610 that includes one or more inductors and a second section 622 that includes one or more capacitors. In some aspects, the one or more capacitors and the one or more inductors are configured to form an inductor-capacitor (LC) filter, or other passive device based components. The one or more capacitors and the one or more inductors or the inductor-capacitor (LC) filter may be used in a multiplexer (e.g., diplexer).

In one aspect, the solenoid structure 600 may be formed using conductive pillar technology (e.g., copper pillar technology) instead of through glass via technology. For example, the three-dimensional solenoid structure 600 includes a substrate 608 (e.g., passive substrate), a first inductor portion 603, a second inductor portion 607, a first capacitor portion 609, a second capacitor portion 611, a first inductor pillar 615, a second inductor pillar 625, a third inductor pillar 635, a fourth inductor pillar 645, a first capacitor pillar 655, and a second capacitor pillar 665. The three-dimensional solenoid structure 600 also includes a first inductor bonding interface 613, a second inductor bonding interface 617, a capacitor bonding interface 619, a first bonding interconnect 621, a second bonding interconnect 623, a third bonding interconnect 627, and a molding compound 605.

The first inductor portion 603 includes a first surface 629 and a second surface 631 opposite the first surface 629. The second inductor portion 607 includes a first surface 633 and a second surface 637 opposite the first surface 633. The first inductor pillar 615 and the third inductor pillar 635 are coupled to the first surface 629 of the first inductor portion 603. The second inductor pillar 625 and the fourth inductor pillar 645 are coupled to the first surface 633 of the second inductor portion 607. The first capacitor portion 609 is coupled between the first capacitor pillar 655 and the substrate 608 (e.g., a die or wafer). In one aspect of the disclosure, the substrate 608 is a glass substrate. The first capacitor portion 609 may be a metal (612)-insulator (614)-metal (618) (MIM) capacitor. The second capacitor portion 611 is coupled between the second capacitor pillar 665 and the third bonding interconnect 627. Similar to the first capacitor portion 609, the second capacitor portion 611 may be a MIM capacitor. The first bonding interconnect 621 and the second bonding interconnect 623 may be coupled to the second surface 637 of the second inductor portion 607. The first bonding interconnect 621, the second bonding interconnect 623, and the third bonding interconnect 627 may be configured to couple the three-dimensional solenoid structure 600 to another device.

The first inductor bonding interface 613 is included between the first inductor pillar 615 and the second inductor pillar 625 to couple the first inductor portion 603 and the second inductor portion 607. The second inductor bonding interface 617 is included between the third inductor pillar 635 and the fourth inductor pillar 645 to couple the first inductor portion 603 and the second inductor portion 607 to form the three-dimensional solenoid structure 600. The capacitor bonding interface 619 is included between the first capacitor pillar 655 and the second capacitor pillar 665 to couple the first capacitor portion 609 and the second capacitor portion 611.

The molding compound 605 may be included between the first inductor portion 603 and the second inductor portion 607 as well as between the first capacitor portion 609 and the second capacitor portion 611. For example, the molding compound 605 is on the first inductor portion 603, the substrate 608, the second inductor portion 607, the first capacitor portion 609, the second capacitor portion 611, the first inductor pillar 615, the second inductor pillar 625, the third inductor pillar 635, the fourth inductor pillar 645, the first capacitor pillar 655, the second capacitor pillar 665, the first inductor bonding interface 613, the second inductor bonding interface 617, and the capacitor bonding interface 619. In one aspect of the disclosure, the molding compound 605 is an epoxy molding compound or capillary underfill material.

FIGS. 7A-7D illustrate multiple stages of a process for fabricating a three-dimensional solenoid structure (e.g., the three-dimensional solenoid structure 600 of FIG. 6), according to aspects of the present disclosure. For illustrative purposes, some of the labelling and numbering of the devices and features of FIGS. 7A-7D are similar to those of FIG. 6.

Figure 7A:
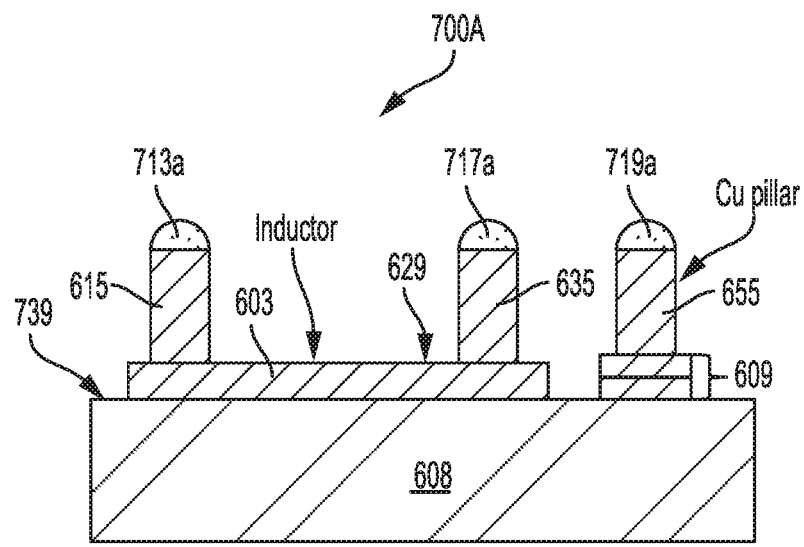
FIGS. 7A-7D illustrate a process for fabricating a three-dimensional solenoid structure, according to aspects of the present disclosure.

FIG. 7A illustrates a first stage for forming a first portion 700A of the three-dimensional solenoid structure 600. The first portion 700A of the three-dimensional solenoid structure 600 may have a first starting substrate (e.g., the substrate 608 of FIG. 6) that includes a supporting surface 739. The first inductor portion 603 and the first capacitor portion 609 are fabricated on the substrate 608. The first inductor pillar 615 and the third inductor pillar 635 are fabricated on the first surface 629 of the first inductor portion 603. Bonding materials may be deposited or fabricated on portions of the first inductor pillar 615 and the third inductor pillar 635 as well as the first capacitor pillar 655 to facilitate coupling other conductive pillars to the first inductor pillar 615, the third inductor pillar 635, and the first capacitor pillar 655. For example, a first bonding material 713a is formed on the first inductor pillar 615, a second bonding material 717a is formed on the third inductor pillar 635, and a third bonding material 719a is formed on the first capacitor pillar 655.

Figure 7B:
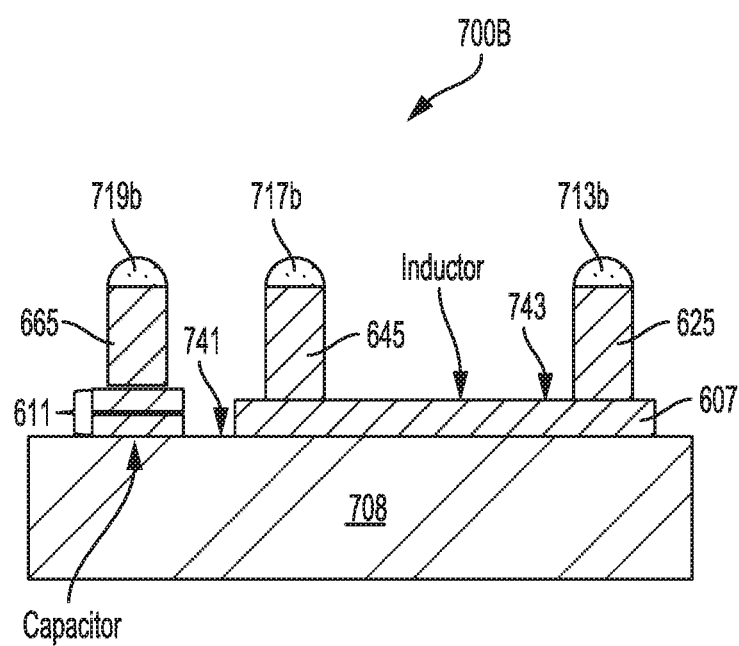

FIG. 7B illustrates a second stage for forming a second portion 700B of the three-dimensional solenoid structure 600. The second portion 700B of the three-dimensional solenoid structure 600 may have a second starting substrate 708 (e.g., die or wafer) that includes a supporting surface 741. The second inductor portion 607 and the second capacitor portion 611 are fabricated on the second starting substrate 708 (e.g., a passive substrate). The second inductor pillar 625 and the fourth inductor pillar 645 are fabricated on a first surface 743 of the second inductor portion 607. Bonding materials may be deposited or fabricated on portions of the second inductor pillar 625 and the fourth inductor pillar 645 as well as the second capacitor pillar 665 to facilitate coupling other conductive pillars to the second inductor pillar 625, the fourth inductor pillar 645, and the second capacitor pillar 665. For example, a fourth bonding material 713b is formed on the second inductor pillar 625, a fifth bonding material 717b is formed on the fourth inductor pillar 645, and a sixth bonding material 719b is formed on the second capacitor pillar 665. The first portion 700A and the second portion 700B may be fabricated in parallel or simultaneously according to a die process where a redistribution layer is formed on the substrate 608 and the second starting substrate 708, according to aspects of the present disclosure. The fabrication of the first portion 700A and the second portion 700B may include fabrication of one or more redistribution layers (RDLs).

Figure 7C:
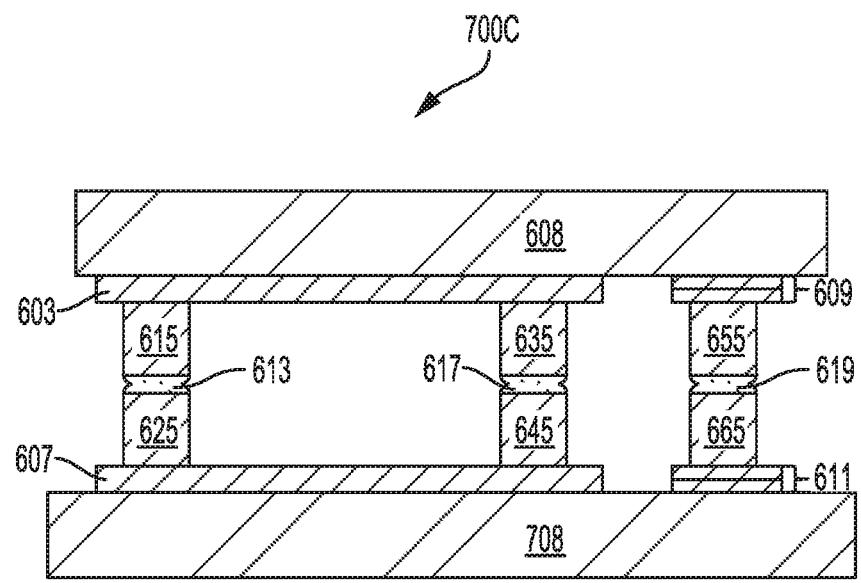

FIG. 7C illustrates a third stage, which includes a die attach process for forming the three-dimensional solenoid structure. The die attach process includes bonding the conductive pillars of the first portion 700A and the second portion 700B to form a three-dimensional solenoid structure 700C. For example, the first inductor pillar 615 is bonded to the second inductor pillar 625 with the first bonding material 713a of FIG. 7A and the fourth bonding material 713b of FIG. 7B to form the first inductor bonding interface 613. The third inductor pillar 635 is bonded to the fourth inductor pillar 645 with the second bonding material 717a of FIG. 7A and the fifth bonding material 717b of FIG. 7B to form the second inductor bonding interface 617. The first capacitor pillar 655 is bonded to the second capacitor pillar 665 with the third bonding material 719a of FIG. 7A and the sixth bonding material 719b of FIG. 7B to form the capacitor bonding interface 619.

Figure 7D:
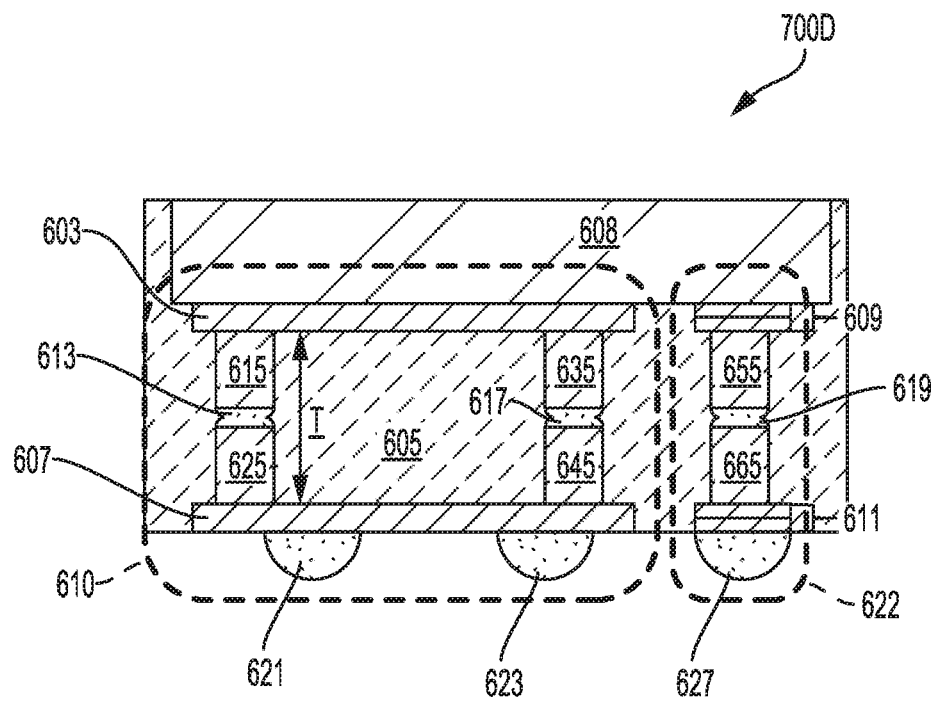

FIG. 7D illustrates a fourth and final stage of the of the fabrication process for a three-dimensional solenoid structure 700D. The fourth stage may include encapsulating at least a portion of the three-dimensional solenoid structure 700C with the molding compound 605 to form the three-dimensional solenoid structure 700D. The final stage of the of the fabrication process for the three-dimensional solenoid structure 700D may also include removing (e.g., etching) the second starting substrate 708. The final stage of the fabrication process for the three-dimensional solenoid structure 700D may further include fabricating the first bonding interconnect 621 and the second bonding interconnect 623 to the second surface 637 of the second inductor portion 607. Furthermore, the final stage of the of the fabrication process for the three-dimensional solenoid structure 700D may include fabricating the third bonding interconnect 627 to the second capacitor portion 611. The three-dimensional solenoid structure 700D is similar to the three-dimensional solenoid structure 600 illustrated and described with reference to FIG. 6.

FIGS. 8A-8F illustrate multiple stages of another process for fabricating a three-dimensional solenoid structure (e.g., the three-dimensional solenoid structure 600 of FIG. 6), according to aspects of the present disclosure. For illustrative purposes, some of the labelling and numbering of the devices and features of FIGS. 8A-8F are similar to those of FIGS. 7A-7D and FIG. 6. For example, the process of FIG. 8A (a first stage of forming the three-dimensional solenoid structure) is the same as the process of FIG. 7A and FIG. 7B where the first portion 700A and the second portion 700B are formed.

FIG. 8B illustrates a second stage, which includes a die attach process as well as an encapsulating process for forming a three-dimensional solenoid structure 800B. The die attach process of FIG. 8B is similar to the die attach process of FIG. 7C where the first portion 700A is bonded to the second portion 700B. However, in addition to the die attach process, FIG. 8B also includes encapsulating at least a portion of the three-dimensional solenoid structure 700C with the molding compound 605 to form the three-dimensional solenoid structure 800B. In some aspects, the first portion 700A may be subject to some grinding or sawing to grind down the substrate 608 to a desirable thickness.

Figure 8D:
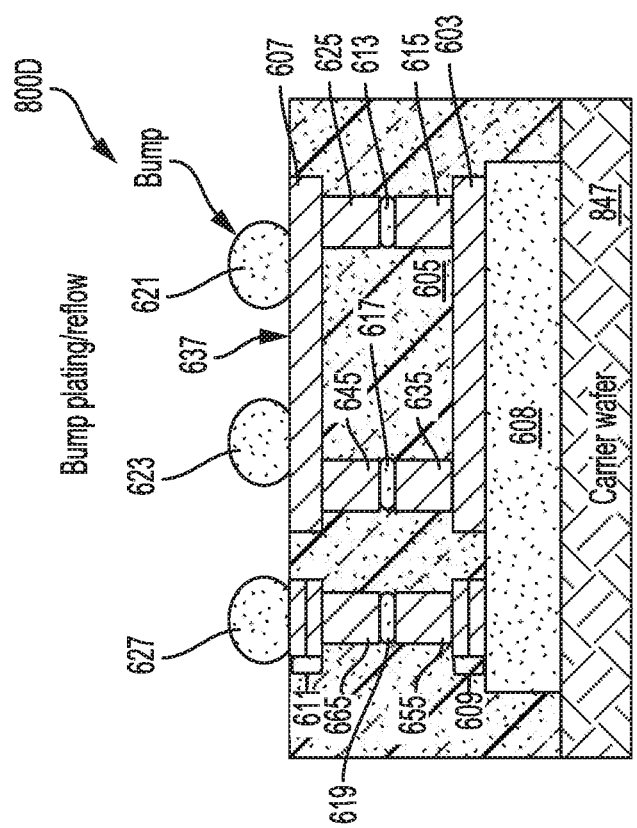
Figure 8C:
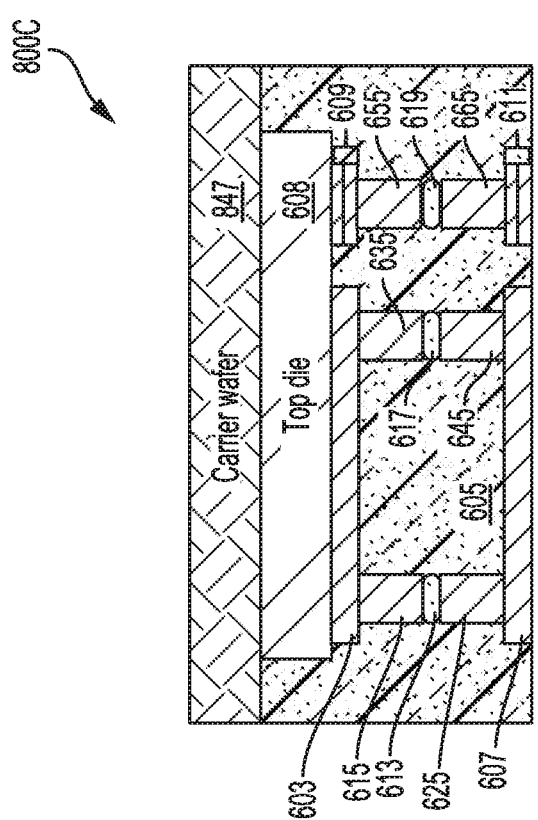

FIG. 8C illustrates a third stage, which includes removing or de-bonding (e.g., etching) the second starting substrate 708 to form a three-dimensional solenoid structure 800C. Optionally, the grinding or sawing of the first portion 700A may occur in the third stage. Optionally, the third stage may include bonding a carrier wafer 847 to the first portion 700A. The third stage may further include dry etching to remove remaining silicon from the second starting substrate 708. It is to be noted that some or all of these process steps are for a no-glass option.

FIG. 8D illustrates a fourth stage of forming a three-dimensional solenoid structure 800D, which includes fabricating the first bonding interconnect 621 and the second bonding interconnect 623 to the second surface 637 of the second inductor portion 607. Furthermore, the fourth stage of the fabrication process for the three-dimensional solenoid structure 800D may include fabricating the third bonding interconnect 627 to the second capacitor portion 611. In one aspect, the first bonding interconnect 621, the second bonding interconnect 623 and the third bonding interconnect 627 may be fabricated by a bump plating/reflow process.

Figure 8F:
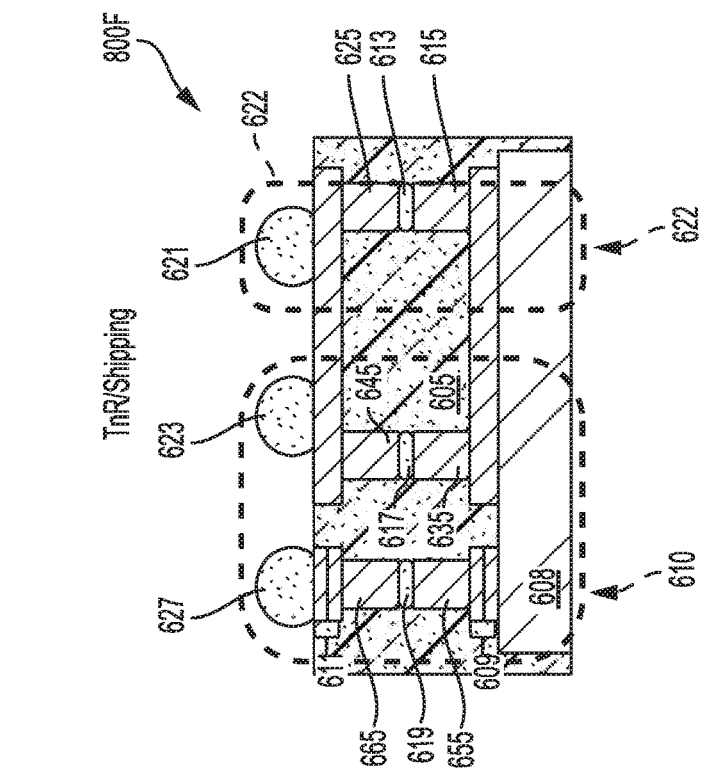
Figure 8E:
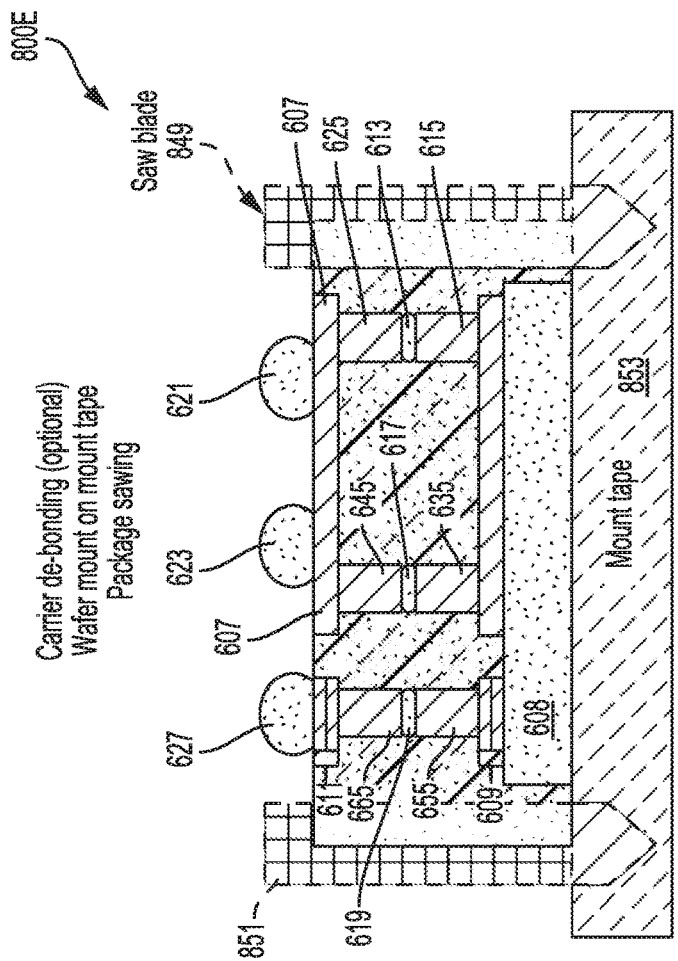

FIG. 8E illustrates a fifth stage, which includes removing or de-bonding (e.g., etching) the carrier wafer 847 to form a three-dimensional solenoid structure 800E. This process, however, is optional. The resulting three-dimensional solenoid structure (without the carrier wafer 847) is mounted on a mount tape 853 where portions of the three-dimensional solenoid structure 800E are removed (e.g., by sawing). For example, a saw blade 849 and/or 851 is used for the package sawing to remove some portions (e.g., sidewalls) of the three-dimensional solenoid structure 800E.

FIG. 8F illustrates a final stage of forming a three-dimensional solenoid structure 800F. The three-dimensional solenoid structure 800F is similar to the three-dimensional solenoid structure 700D illustrated and described in FIG. 7D or the three-dimensional solenoid structure 600 illustrated and described in FIG. 6.

Figure 9A:
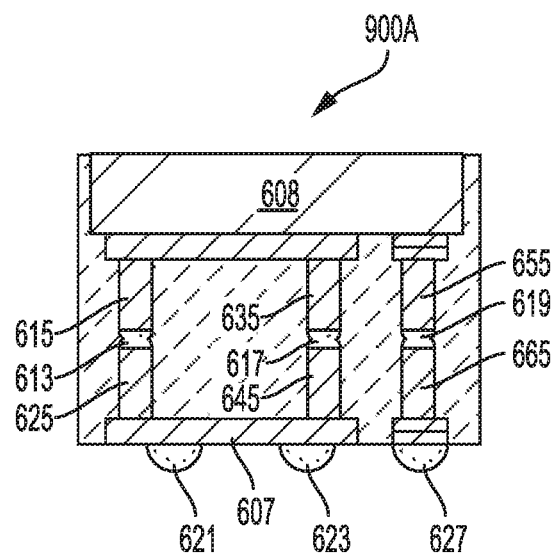
FIGS. 9A-9B illustrate a process for fabricating a three-dimensional solenoid structure without a glass substrate, according to aspects of the present disclosure.
Figure 9B:
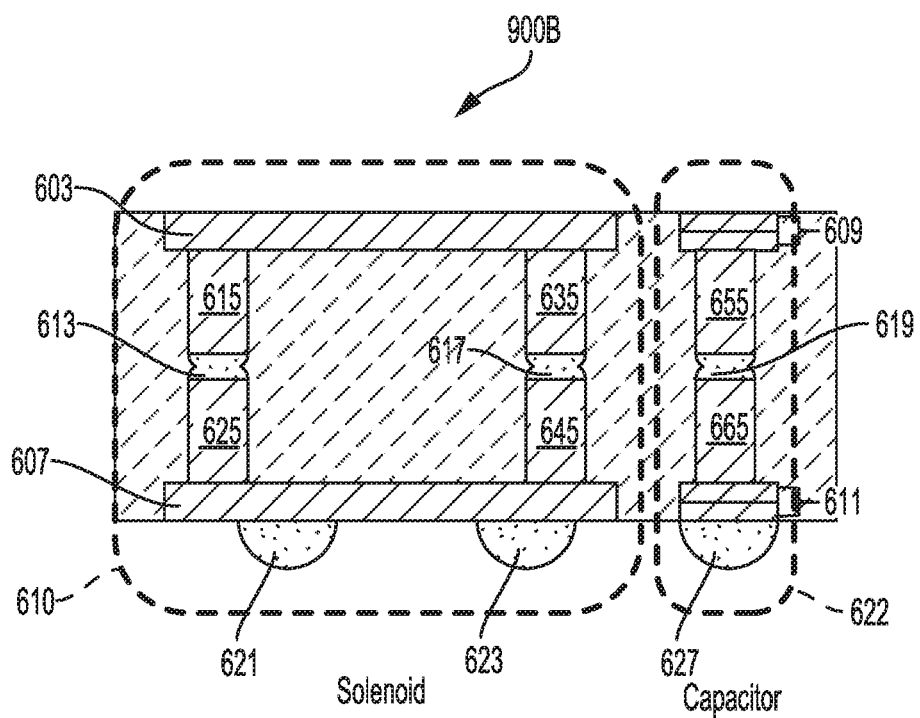

FIGS. 9A-9B illustrate a process for fabricating a three-dimensional solenoid structure without a glass substrate, according to aspects of the present disclosure.

FIG. 9A illustrates a first stage, which includes removing or de-bonding (e.g., etching) the substrate 608. The first stage may start with a three-dimensional solenoid structure 900A, which is similar to the three-dimensional solenoid structure 800F illustrated and described in FIG. 8F, the three-dimensional solenoid structure 700D illustrated and described in FIG. 7D, or the three-dimensional solenoid structure 600 illustrated and described in FIG. 6. The substrate 608 is then removed or de-bonded.

FIG. 9B illustrates a final stage of forming a three-dimensional solenoid structure 900B. The three-dimensional solenoid structure 900B is similar to the three-dimensional solenoid structure 800F illustrated and described in FIG. 8F, the three-dimensional solenoid structure 700D illustrated and described in FIG. 7D, or the three-dimensional solenoid structure 600 illustrated and described in FIG. 6. However, the three-dimensional solenoid structure 900B does not include the substrate 608. In this aspect, there are no silicon or glass substrate in order to achieve a thinner profile.

Figure 10A:
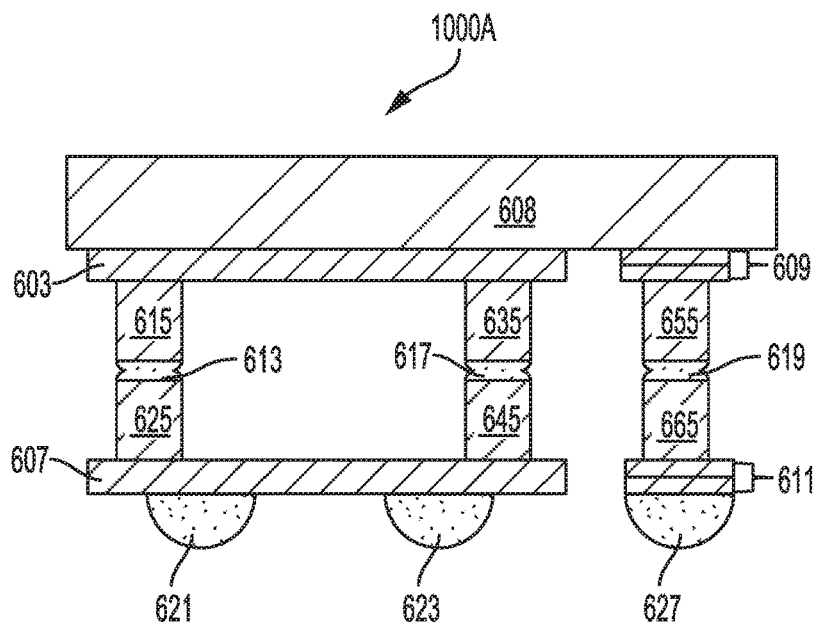
FIG. 10A illustrates a three-dimensional solenoid structure with an air-core/suspension configuration, according to aspects of the present disclosure.

FIG. 10A illustrates a three-dimensional solenoid structure 1000A with an air-core/suspension configuration, according to aspects of the present disclosure. The three-dimensional solenoid structure 1000A is similar to the three-dimensional solenoid structure 800F illustrated and described in FIG. 8F, the three-dimensional solenoid structure 700D illustrated and described in FIG. 7D, or the three-dimensional solenoid structure 600 illustrated and described in FIG. 6. However, the three-dimensional solenoid structure 1000A is not encapsulated with the molding compound 605. As a result, portions of the region between the substrate 608 and the bonding interconnects 621, 623, and 627 are open or have an air-core/suspension configuration.

Figure 10B:
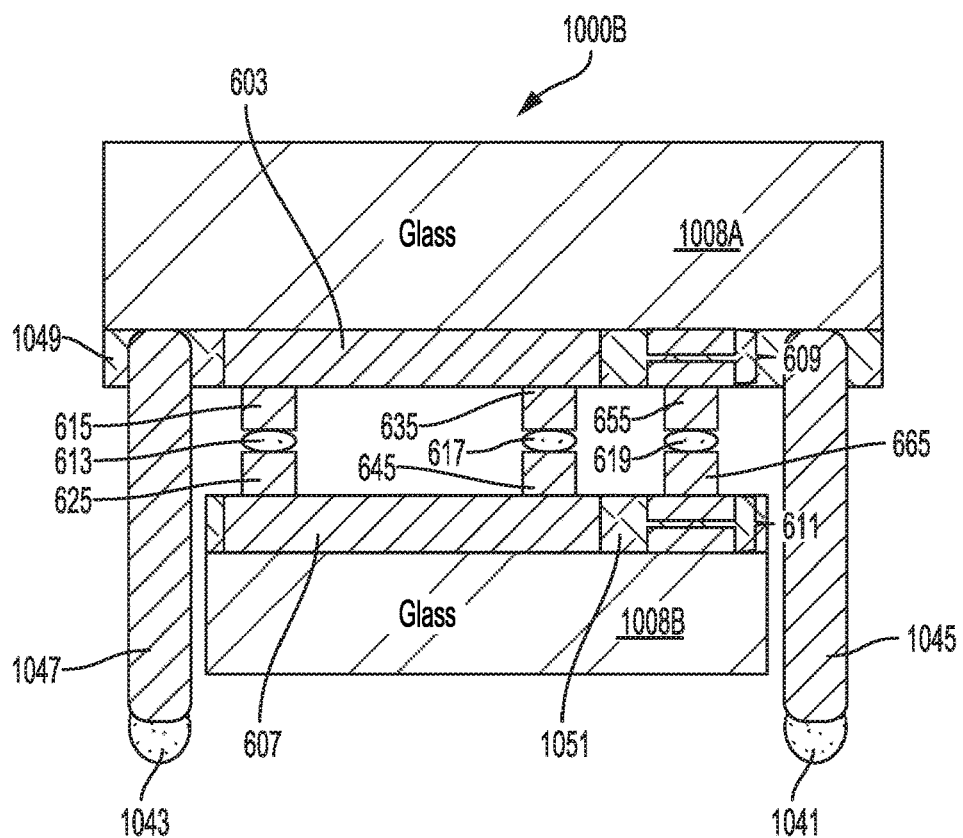
FIG. 10B illustrates a three-dimensional solenoid structure with a glass-to-glass substrate package-on-package (PoP) configuration, according to aspects of the present disclosure.

FIG. 10B illustrates a three-dimensional solenoid structure 1000B with a glass-to-glass substrate package-on-package (PoP) configuration, according to aspects of the present disclosure. The three-dimensional solenoid structure 1000B of FIG. 10B is for illustrative purposes, some of the labelling and numbering of the devices and features of FIG. 10B are similar to those of FIG. 7C. However, the three-dimensional solenoid structure 1000B includes a first glass substrate 1008A and a second glass substrate 1008B. A first molding compound 1049 on the first glass substrate 1008A and a second molding compound 1051 on the second glass substrate 1008B partially encapsulate the three-dimensional solenoid structure 1000B leaving portions of the three-dimensional solenoid structure 1000B in an air-core/suspension configuration.

The three-dimensional solenoid structure 1000B further includes a first conductive (e.g., metal) pillar 1045 and a second conductive (e.g., metal) pillar 1047. In one aspect, the first conductive pillar 1045 and the second conductive pillar 1047 are coupled to the first glass substrate 1008A and not the second glass substrate 1008B. Bonding interconnects 1041 and 1043 are coupled to exposed ends of each of the first conductive pillar 1045 and the second conductive pillar 1047. The second glass substrate 1008B can be removed.

Figure 10C:
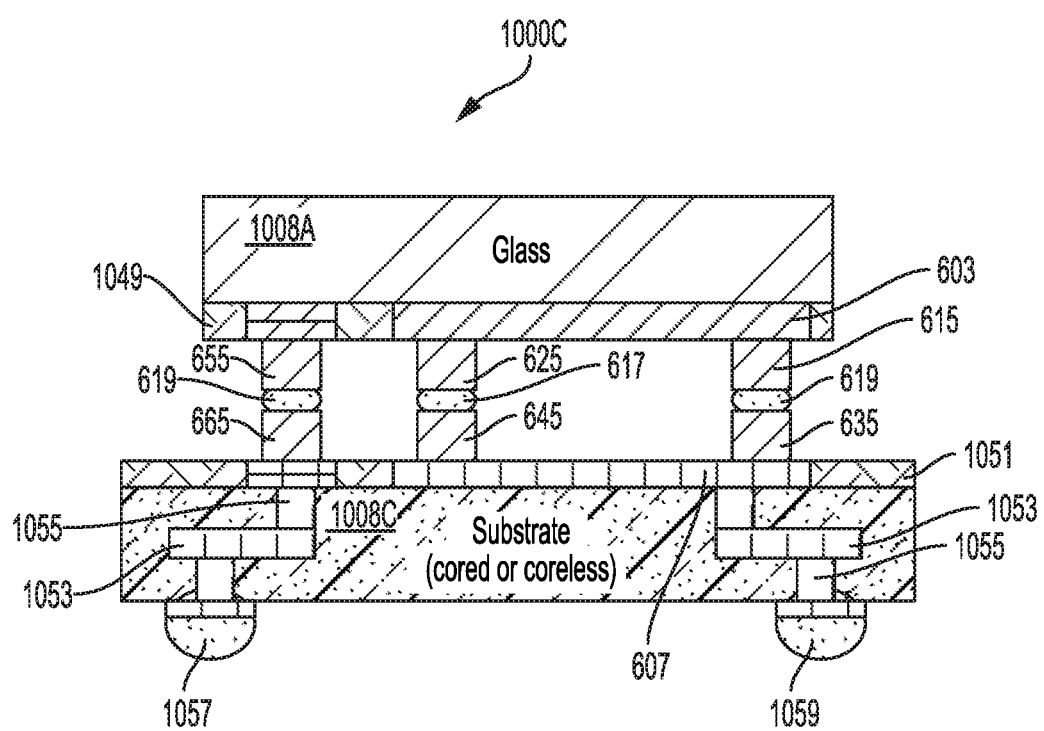
FIG. 10C illustrates a three-dimensional solenoid structure with a glass-to-laminate substrate package-on-package (PoP) configuration, according to aspects of the present disclosure.

FIG. 10C illustrates a three-dimensional solenoid structure 1000C with a glass-to-laminate substrate package-on-package (PoP) configuration, according to aspects of the present disclosure. For illustrative purposes, some of the labelling and numbering of the devices and features of FIG. 10C are similar to those of FIG. 10B. While the three-dimensional solenoid structure 1000C is similar to the three-dimensional solenoid structure 1000B, the second substrate 1008C of the three-dimensional solenoid structure 1000C can be a laminate substrate. The second substrate 1008C can also be glass, semiconductor (e.g., silicon) or an organic substrate. Moreover, the three-dimensional solenoid structure 1000C does not include the first conductive pillar 1045 and the second conductive pillar 1047. Instead, the three-dimensional solenoid structure 1000C includes redistribution layers 1053, vias 1055, and conductive pillars 1057 and 1059 to connect the three-dimensional solenoid structure 1000C to external circuits. In some aspects, the three-dimensional solenoid structure 1000C may have an air-core/suspension configuration (as in FIG. 10A) or an encapsulated configuration (as in FIG. 7D).

Figure 11:
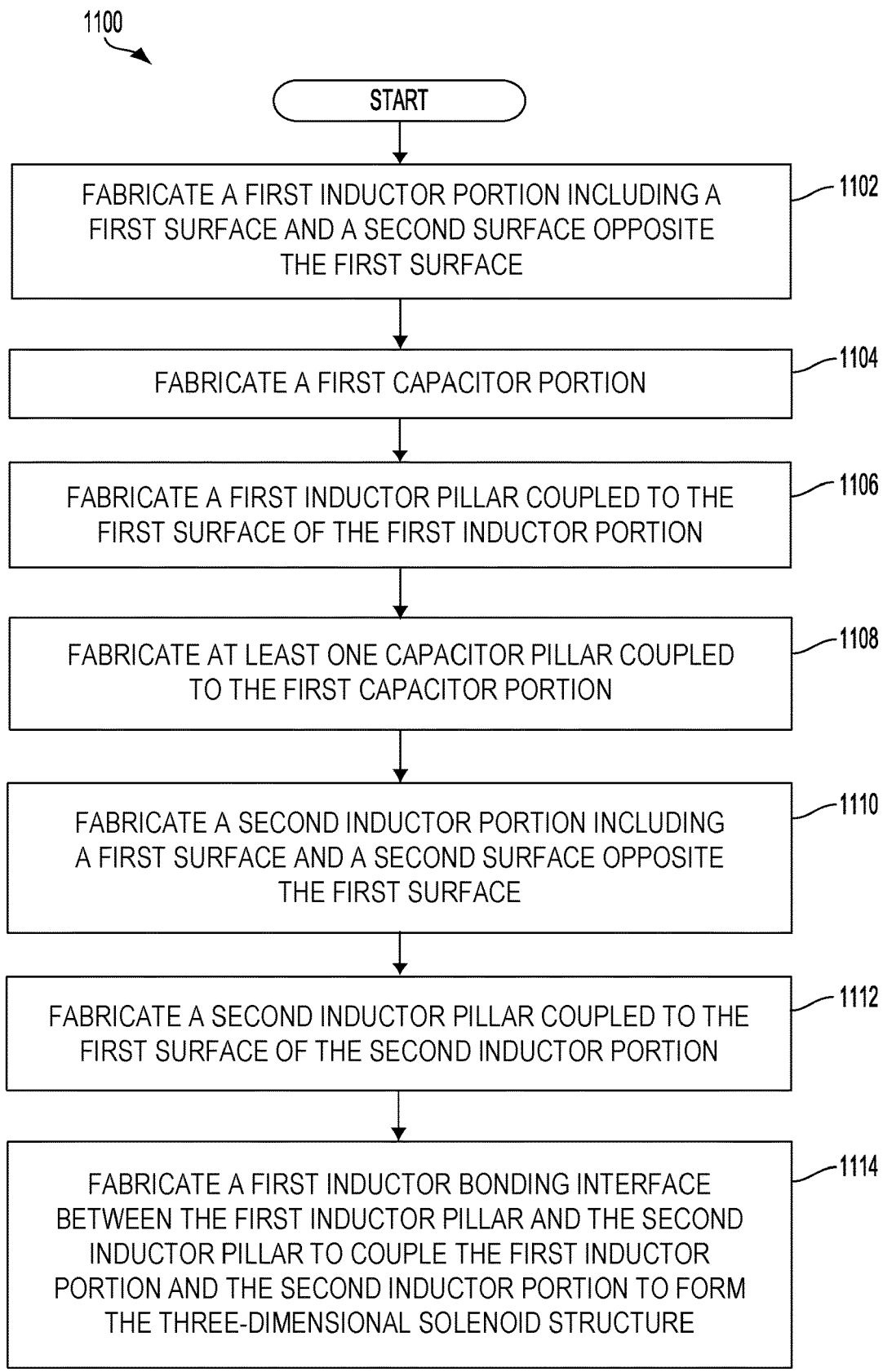
FIG. 11 is a flow diagram illustrating a method of fabricating a solenoid structure, according to aspects of the present disclosure.

FIG. 11 is a flow diagram illustrating a method 1100 of fabricating a three-dimensional solenoid structure, according to aspects of the present disclosure. At block 1102, a first inductor portion including a first surface and a second surface opposite the first surface is fabricated. At block 1104, a first capacitor portion is fabricated. At block 1106, a first inductor pillar coupled to the first surface of the first inductor portion is fabricated. At block 1108, one or more capacitor pillars coupled to the first capacitor portion are fabricated. At block 1110, a second inductor portion including a first surface and a second surface opposite the first surface is fabricated. At block 1112, a second inductor pillar coupled to the first surface of the second inductor portion is fabricated. At block 1114, a first inductor bonding interface between the first inductor pillar and the second inductor pillar is fabricated. The first inductor bonding interface is configured to couple the first inductor portion and the second inductor portion to form the three-dimensional solenoid structure.

According to one aspect of the present disclosure, a three-dimensional solenoid structure is described. The three-dimensional solenoid structure includes means for bonding the first inductor pillar and the second inductor pillar to couple the first inductor portion and the second inductor portion. The bonding means may, for example, be the first inductor bonding interface 613, the second inductor bonding interface 617, the first bonding material 713a, the second bonding material 717a, the fourth bonding material 713b and/or the fifth bonding material 717b. In another aspect, the aforementioned means may be any module or any apparatus or material configured to perform the functions recited by the aforementioned means.

Figure 12:
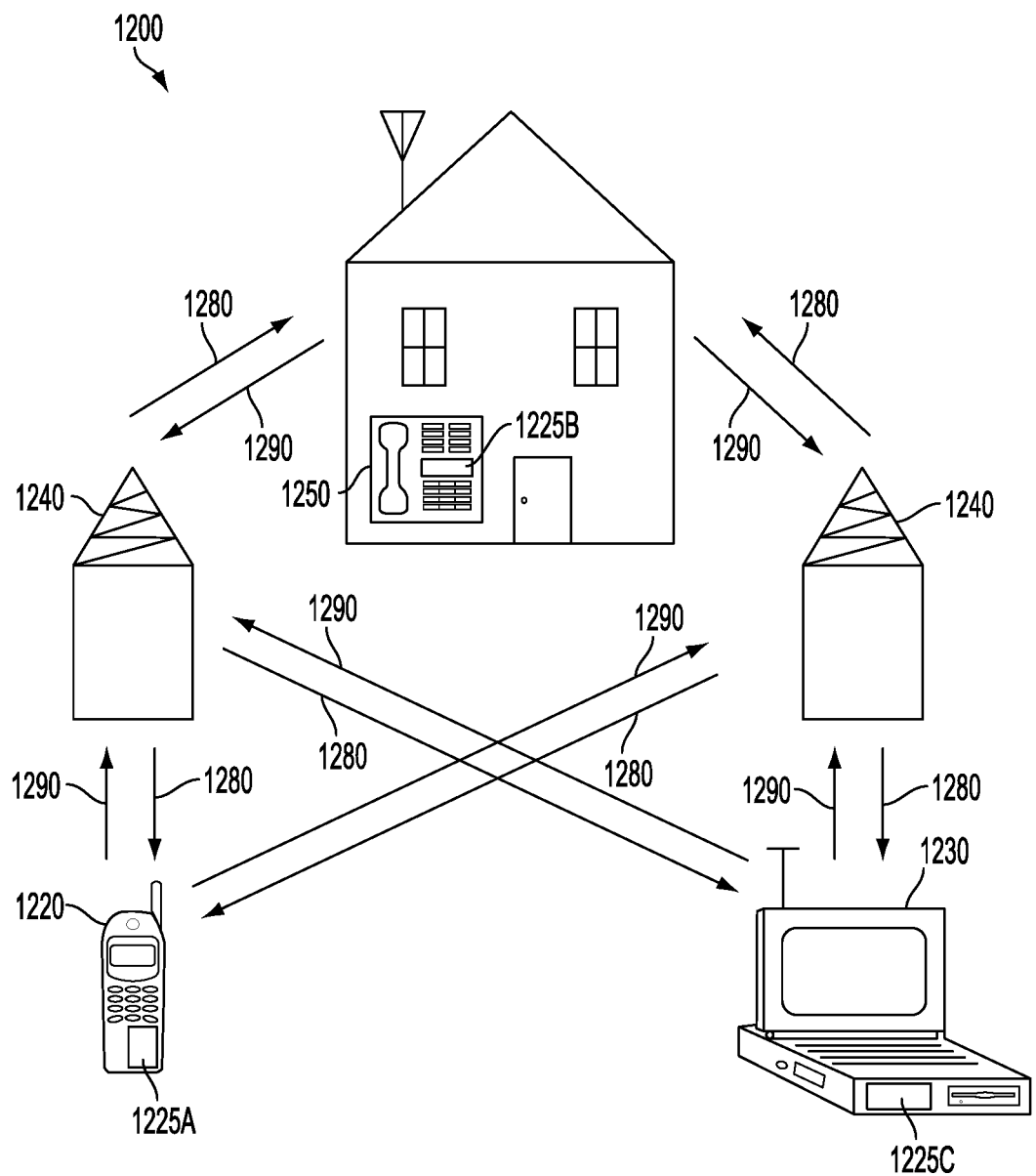
FIG. 12 is a block diagram showing an exemplary wireless communication system in which a configuration of the present disclosure may be advantageously employed.

FIG. 12 is a block diagram showing an exemplary wireless communication system 1200 in which an aspect of the present disclosure may be advantageously employed. For purposes of illustration, FIG. 12 shows three of the remote units 1220, 1230, and 1250 and two of the base stations

1240. It will be recognized that wireless communication systems may have many more remote units and base stations. Remote units 1220, 1230, and 1250 each include IC devices 1225A, 1225C, and 1225B having a radio frequency (RF) front-end module that includes the disclosed three-dimensional solenoid structure. It will be recognized that other devices may also include the disclosed three-dimensional solenoid structure, such as the base stations, switching devices, and network equipment including a RF front-end module. FIG. 12 shows forward link signals 1280 from one of the base stations 1240 to the remote units 1220, 1230, and 1250 and reverse link signals 1290 from the remote units 1220, 1230, and 1250 to base stations 1240.

In FIG. 12, one of the remote units 1220 is shown as a mobile telephone, one of the remote units 1230 is shown as a portable computer, and remote unit 1250 is shown as a fixed location remote unit in a wireless local loop system. For example, the remote units 1220, 1230, and 1250 may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or a communications device, including an RF front-end module, that stores or retrieves data or computer instructions, or combinations thereof. Although FIG. 12 illustrates remote units according to the aspects of the present disclosure, the present disclosure is not limited to these exemplary illustrated units. Aspects of the present disclosure may be suitably employed in many devices, which include the disclosed three-dimensional solenoid structure.

Figure 13:
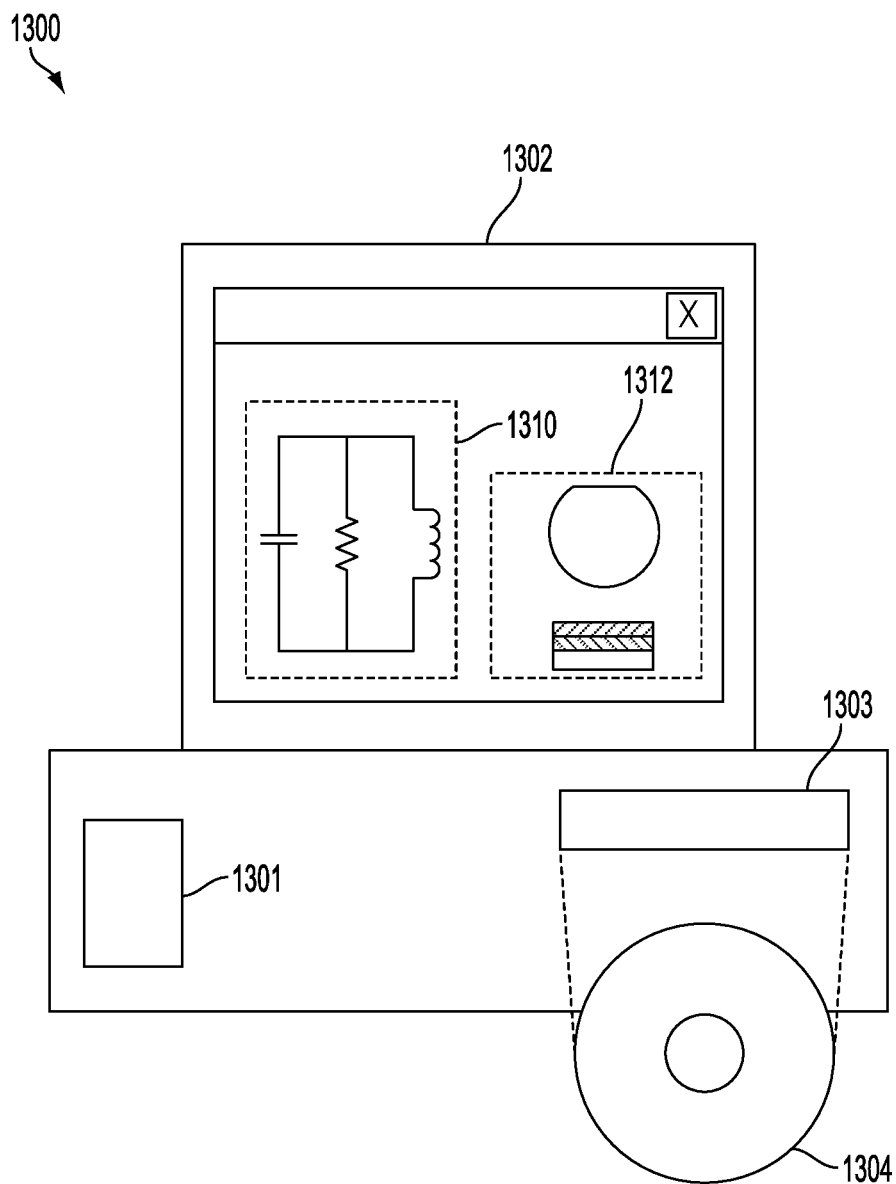
FIG. 13 is a block diagram illustrating a design workstation used for circuit, layout, and logic design of an inductor-capacitor (LC) filter, according to aspects of the present disclosure.

FIG. 13 is a block diagram illustrating a design workstation used for circuit, layout, and logic design of the three-dimensional solenoid structure disclosed above. A design workstation 1300 includes a hard disk 1301 containing operating system software, support files, and design software such as Cadence or OrCAD. The design workstation 1300 also includes a display 1302 to facilitate design of a circuit 1310 or the three-dimensional solenoid structure. A storage medium 1304 is provided for tangibly storing the design of the circuit 1310 or the three-dimensional solenoid structure. The design of the circuit 1310 or the three-dimensional solenoid structure may be stored on the storage medium 1304 in a file format such as GDSII or GERBER. The storage medium 1304 may be a CD-ROM, DVD, hard disk, flash memory, or other appropriate device. Furthermore, the design workstation 1300 includes a drive apparatus 1303 for accepting input from or writing output to the storage medium 1304.

Data recorded on the storage medium 1304 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1304 facilitates the design of the circuit 1310 or the three-dimensional solenoid structure by decreasing the number of processes for designing semiconductor or passive wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a non-transitory computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b, and c. All structural and functional equivalents to the elements of the various aspects described throughout this present disclosure that are known or later come to be known to those of ordinary skill in the art are expressly incorporated herein by reference and are intended to be encompassed by the claims. Moreover, nothing disclosed herein is intended to be dedicated to the public regardless of whether such present disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A three-dimensional solenoid structure, comprising:
    a first inductor portion including a first surface and a second surface opposite the first surface;
    a first capacitor portion;
    a first inductor pillar coupled to the first surface of the first inductor portion, the first inductor pillar having a first bonding material at an end away from the first surface;
    at least one capacitor pillar coupled to the first capacitor portion;
    a second inductor portion including a third surface and a fourth surface opposite the third surface;
    a second inductor pillar coupled to the third surface of the second inductor portion, the second inductor pillar having a second bonding material at an end near the first bonding material; and
    a first inductor bonding interface between the first inductor pillar and the second inductor pillar to couple the first inductor portion and the second inductor portion, the first inductor bonding interface comprising the first bonding material and the second bonding material.

2. The three-dimensional solenoid structure of claim 1, further comprising a molding compound in between the first inductor portion and the second inductor portion.

3. The three-dimensional solenoid structure of claim 2, in which the molding compound comprises epoxy molding compound or capillary underfill material.

4. The three-dimensional solenoid structure of claim 1, further comprising a glass substrate, in which the second surface of the first inductor portion is on the glass substrate and the first capacitor portion is on the glass substrate.

5. The three-dimensional solenoid structure of claim 1, in which the first capacitor portion comprises a metal-insulator-metal (MIM) capacitor.

6. The three-dimensional solenoid structure of claim 1, further comprising a second capacitor portion, at least one capacitor pillar coupled to the second capacitor portion, the first capacitor portion is opposite to the second capacitor portion.

7. The three-dimensional solenoid structure of claim 6, further comprising a capacitor bonding interface between the at least one capacitor pillar coupled to the first capacitor portion and the at least one capacitor pillar coupled to the second capacitor portion to couple the first capacitor portion and the second capacitor portion.

8. The three-dimensional solenoid structure of claim 1, further comprising:
   a third inductor pillar coupled to the first surface of the first inductor portion;
   a fourth inductor pillar coupled to the third surface of the second inductor portion; and
   a second inductor bonding interface between the third inductor pillar and the fourth inductor pillar to couple the first inductor portion and the second inductor portion.

9. A method of fabricating a three-dimensional solenoid structure comprising:
   fabricating a first inductor portion including a first surface and a second surface opposite the first surface;
   fabricating a first capacitor portion;
   fabricating a first inductor pillar on the first surface of the first inductor portion, the first inductor pillar having a first bonding material at an end away from the first surface;
   fabricating at least one capacitor pillar on the first capacitor portion;
   fabricating a second inductor portion including a third surface and a fourth surface opposite the third surface;
   fabricating a second inductor pillar on the third surface of the second inductor portion, the second inductor pillar having a second bonding material at an end near the first bonding material; and
   bonding the first inductor pillar to the second inductor pillar with the first bonding material and the second bonding material to couple the first inductor portion and the second inductor portion.

10. The method of claim 9, further comprising depositing a molding compound between the first inductor portion and the second inductor portion.

11. The method of claim 9, further comprising fabricating a glass substrate, in which the second surface of the first inductor portion is on the glass substrate and the first capacitor portion is on the glass substrate.

12. The method of claim 9, further comprising fabricating a second capacitor portion, at least one capacitor pillar coupled to the second capacitor portion, the first capacitor portion is opposite to the second capacitor portion.

13. The method of claim 12, further comprising fabricating a capacitor bonding interface between the at least one capacitor pillar coupled to the first capacitor portion and the at least one capacitor pillar coupled to the second capacitor portion to couple the first capacitor portion and the second capacitor portion.

14. The three-dimensional solenoid structure of claim 9, further comprising:
   fabricating a third inductor pillar coupled to the first surface of the first inductor portion;
   fabricating a fourth inductor pillar coupled to the third surface of the second inductor portion; and
   bonding the third inductor pillar to the fourth inductor pillar to couple the first inductor portion and the second inductor portion.

15. A three-dimensional solenoid structure, comprising:
   a first inductor portion including a first surface and a second surface opposite the first surface;
   a first capacitor portion;
   a first inductor pillar coupled to the first surface of the first inductor portion, the first inductor pillar having a first bonding material at an end away from the first surface;
   at least one capacitor pillar coupled to the first capacitor portion;
   a second inductor portion including a third surface and a fourth surface opposite the third surface;
   a second inductor pillar coupled to the third surface of the second inductor portion, the second inductor pillar having a second bonding material at an end near the first bonding material; and
   means for bonding the first bonding material and the second bonding material to couple the first inductor portion and the second inductor portion.

16. The three-dimensional solenoid structure of claim 15, further comprising a molding compound between the first inductor portion and the second inductor portion.

17. The three-dimensional solenoid structure of claim 16, in which the molding compound comprises epoxy molding compound or capillary underfill material.

18. The three-dimensional solenoid structure of claim 15, further comprising a glass substrate on which the second surface of the first inductor portion and the first capacitor portion the glass substrate reside.

19. The three-dimensional solenoid structure of claim 15, in which the first capacitor portion comprises a metal-insulator-metal (MIM) capacitor.

20. The three-dimensional solenoid structure of claim 15, further comprising a second capacitor portion, at least one capacitor pillar coupled to the second capacitor portion, the first capacitor portion is opposite to the second capacitor portion.

* * * * *